(12) United States Patent
Kim et al.

(10) Patent No.: US 11,450,404 B1
(45) Date of Patent: Sep. 20, 2022

(54) MEMORY DEVICE INCLUDING REDUNDANCY MATS

(71) Applicant: SK hynix Inc., Icheon-si (KR)

(72) Inventors: Soo Hwan Kim, Icheon-si (KR); Mi Hyun Hwang, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/370,637

(22) Filed: Jul. 8, 2021

(30) Foreign Application Priority Data

Mar. 31, 2021 (KR) .......... 10-2021-0042376

(51) Int. Cl.
| | |
|---|---|
| *G11C 29/02* | (2006.01) |
| *G11C 29/00* | (2006.01) |
| *G11C 29/42* | (2006.01) |
| *G11C 7/12* | (2006.01) |
| *G11C 7/10* | (2006.01) |
| *G11C 29/44* | (2006.01) |

(52) U.S. Cl.
CPC .......... *G11C 29/789* (2013.01); *G11C 7/1039* (2013.01); *G11C 7/12* (2013.01); *G11C 29/022* (2013.01); *G11C 29/42* (2013.01); *G11C 29/4401* (2013.01); *G11C 29/787* (2013.01)

(58) Field of Classification Search
CPC ....... G11C 29/789; G11C 7/1039; G11C 7/12; G11C 29/022; G11C 29/42; G11C 29/4401; G11C 29/787
See application file for complete search history.

(56) References Cited

U.S. PATENT DOCUMENTS

| | | | |
|---|---|---|---|
| 2017/0084353 A1* | 3/2017 | Park | .................... G11C 11/4087 |
| 2018/0067847 A1* | 3/2018 | Oh | ............................ G11C 8/12 |

FOREIGN PATENT DOCUMENTS

| | | |
|---|---|---|
| KR | 1020120020822 A | 3/2012 |
| KR | 1020130050233 A | 5/2013 |

* cited by examiner

*Primary Examiner* — Mohammed A Bashar
(74) *Attorney, Agent, or Firm* — William Park & Associates Ltd.

(57) ABSTRACT

A memory device includes an at least one first normal mat and an at least one second normal mat, a first redundancy mat configured to provide one or more first redundancy column lines for repairing one or more column lines disposed in the at least one first normal mat, a second redundancy mat configured to provide one or more second redundancy column lines for repairing one or more column lines disposed in the at least one second normal mat, and a redundancy segmented input/output (I/O) line coupled to both of the first redundancy mat and the second redundancy mat.

23 Claims, 13 Drawing Sheets

MEMORY DEVICE INCLUDING REDUNDANCY MATS

CROSS-REFERENCE TO RELATED APPLICATIONS

The present application claims priority under 35 U.S.C. 119(a) to Korean Application No. 10-2021-0042376, filed on Mar. 31, 2021, which is incorporated herein by references in its entirety.

BACKGROUND

1. Technical Field

Various embodiments of the present teachings relate to a to memory device, and more particularly, to a memory device including redundancy mats.

2. Related Art

Memory devices may be damaged by a lot of memory faults which are due to a cell pitch size that becomes smaller with the development of various process techniques. Regarding the memory devices with the memory faults as failed devices may lead to a lot of loss in terms of fabrication yield. Accordingly, various repair techniques have been proposed to provide solutions for the memory faults which are repairable. For example, a large area of each of the memory devices may be assigned to a redundancy area in advance of development of process techniques. Thus, it may be necessary to minimize the redundancy area with efficient control of the redundancy area in order to provide high performance memory devices.

SUMMARY

According to an embodiment, a memory device may include a plurality of first normal mats and a plurality of second normal mats, wherein each of the plurality of first normal mats and each of the plurality of second normal mats include column lines, respectively, a first redundancy mat including first redundancy column lines, wherein each of the first redundancy column lines replace failed column line among the column lines disposed in the each of the plurality of first normal mats, a second redundancy mat including second redundancy column lines, wherein each of the second redundancy column lines replace failed column line among the column lines disposed in the each of the plurality of second normal mats, and a redundancy segmented input/output (I/O) line coupled to both the first redundancy mat and the second redundancy mat.

According to an embodiments, a memory device may include at least one first normal mat and at least one second normal mat, a first redundancy mat configured to provide one or more first redundancy column lines for repairing one or more column lines disposed in the at least one first normal mat, a second redundancy mat configured to provide one or more second redundancy column lines for repairing one or more column lines disposed in the at least one second normal mat, and a redundancy segmented input/output (I/O) line coupled to both the first redundancy mat and the second redundancy mat.

BRIEF DESCRIPTION OF THE DRAWINGS

Certain features of the disclosed technology are illustrated by various embodiments with reference to the attached drawings, in which:

FIG. 10 illustrates a repair operation according to a second repair mode of a memory device according to an embodiment of the present disclosure;

DETAILED DESCRIPTION

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Various embodiments are directed to a memory device having at least one redundancy mat.

Figure 1:
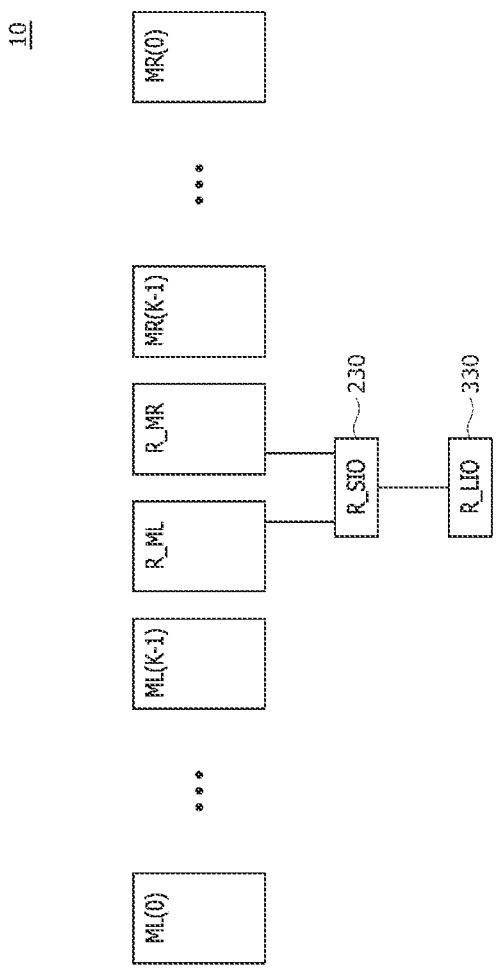
FIG. 1 is a block diagram illustrating a memory device according to an embodiment of the present disclosure.

FIG. 1 is a block diagram illustrating a memory device 10 according to an embodiment of the present disclosure. Referring to FIG. 1, the memory device 10 may include a plurality of first normal mats (e.g., first to $K^{th}$ left normal mats ML(0)~ML(K−1)), a plurality of second normal mats (e.g., first to $K^{th}$ right normal mats MR(0)~MR(K−1)), a first redundancy mat R_ML, a second redundancy mat R_MR, redundancy segmented input/output (I/O) lines (R_SIO) 230, and redundancy local I/O lines (R_LIO) 330 (where, "K" is a natural number). Although not shown in the drawings, each of the first normal mats ML(0)~ML(K−1) and the second normal mats MR(0)~MR(K−1) may have a plurality of column lines.

The first redundancy mat R_ML may provide first redundancy column lines for repairing the column lines of the first normal mats ML(0)~ML(K−1). Thus, main memory cells in a failed column line among the column lines in the first normal mats ML(0)~ML(K−1) may be replaced with redundant memory cells in one of the first redundancy column lines in the first redundancy mat R_ML. The second redundancy mat R_MR may provide second redundancy column lines for repairing the column lines of the second normal mats MR(0)~MR(K−1). Thus, main memory cells in a failed column line among the column lines in the second normal mats ML(0)~ML(K−1) may be replaced with redundant memory cells in one of the second redundancy column lines in the second redundancy mat R_MR.

The redundancy segmented I/O lines 230 may be connected to each of the first redundancy mat R_ML and the second redundancy mat R_MR. That is, read data and write data for the first redundancy mat R_ML as well as read data and write data for the second redundancy mat R_MR may be transmitted through the redundancy segmented I/O lines 230. The redundancy segmented I/O lines 230 may be coupled to the redundancy local I/O line 330.

Figure 2:
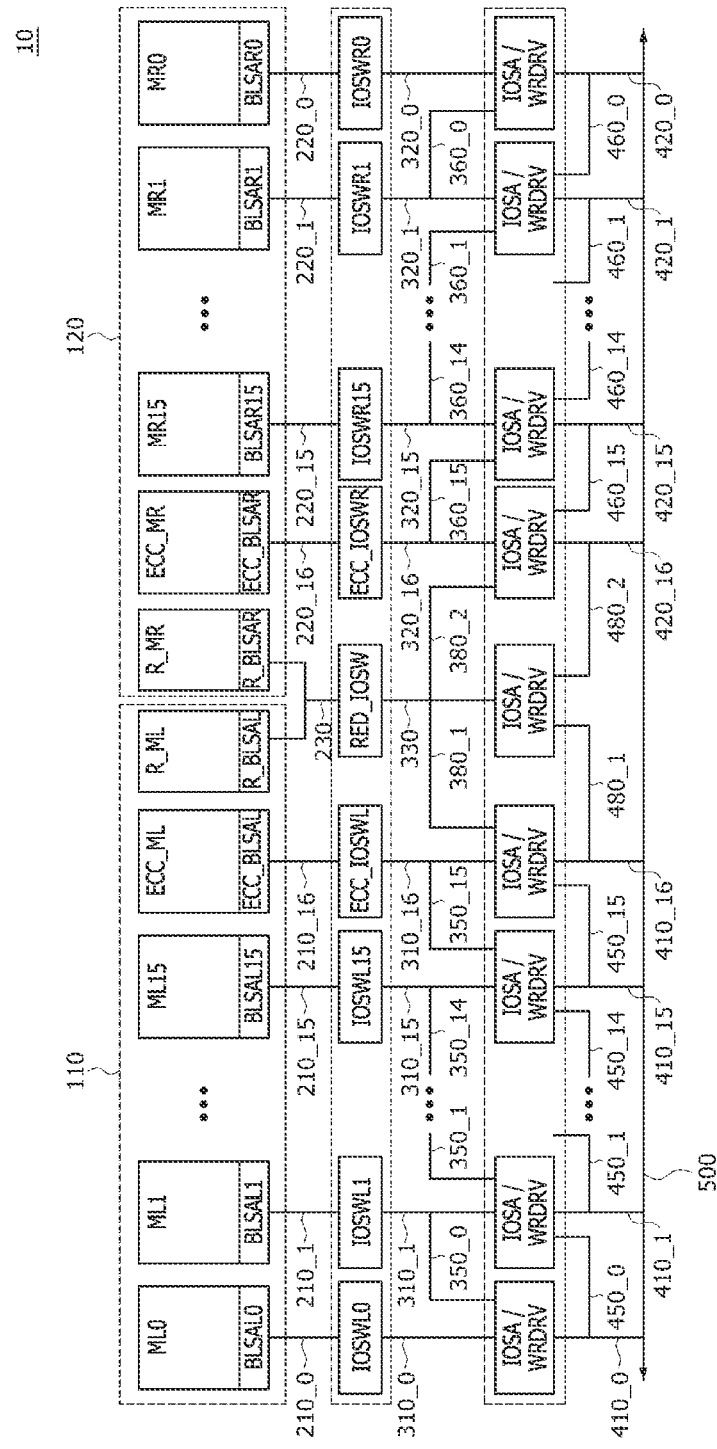
FIG. 2 illustrates a detailed configuration of a memory device according to an embodiment of the present disclosure.
Figure 3:
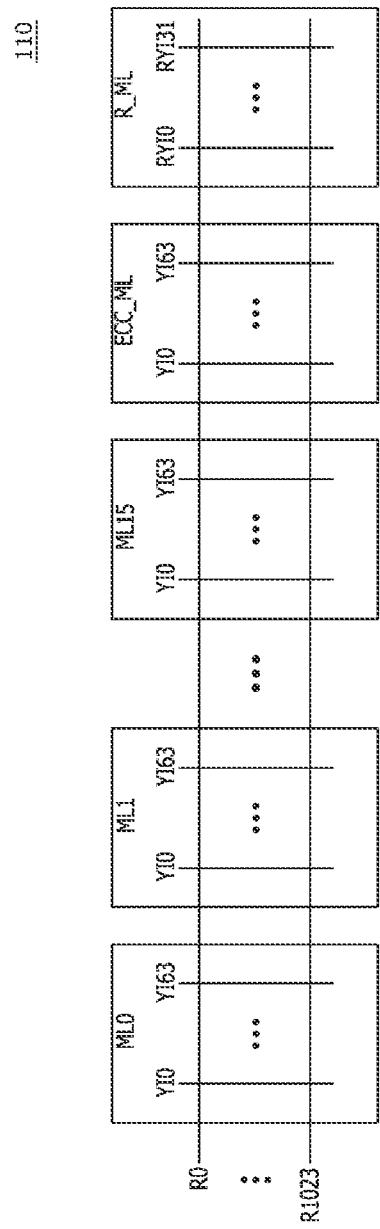
FIG. 3 illustrates an example of a configuration of row lines and column lines which are disposed in first normal mats, a first error correction code (ECC) mat, and a first redundancy mat included in the memory device shown in FIG. 2.

FIG. 2 illustrates a configuration of the memory device 10 of FIG. 1, and FIG. 3 illustrates an example of a configuration of row lines and column lines which are disposed in the first normal mats ML0~ML15, a first error correction code (ECC) mat ECC_ML, and the first redundancy mat R_ML included in the memory device 10 shown in FIG. 2. The explanation described with reference to FIG. 3 will be equally applicable to a configuration of row lines and column lines which are disposed in the second normal mats MR0~MR15, a second ECC mat ECC_MR, and the second redundancy mat R_MR included in the memory device 10 shown in FIG. 2.

First, referring to FIG. 2, the memory device 10 may include a first mat group 110 and a second mat group 120. In the present embodiment, the term "mat" may be defined as a set of memory cells arrayed to share row lines (or word lines) and column lines (or bit lines) with each other and to have the same shape. In addition, the term "mat group" may be defined as a set of normal mats and a redundancy mat which are configured to have a size of one page. The mat group may further include an ECC mat. The memory device 10 according to the present embodiment may be a DRAM device. However, the memory device 10 is not limited to the DRAM device in other embodiments. For example, in some other embodiments, the memory device 10 may be one of various memory devices such as random access memory (RAM) devices, read only memory (ROM) devices, synchronous dynamic random access memory (SDRAM) devices, NAND-type flash memory devices, NOR-type flash memory devices, phase change random access memory (PCRAM) devices, magnetic random access memory (MRAM) devices, resistive random access memory (ReRAM) devices, and ferroelectric random access memory (FRAM) devices. In an embodiment, the first and second mat groups 110 and 120 may constitute one bank. In such a case, the first and second mat groups 110 and 120 may be referred to as a left bank and a right bank, respectively.

The first mat group 110 may include a plurality of first normal mats. In the present embodiment, it may be assumed that the first mat group 110 may include sixteen first normal mats, that is, first to sixteenth left normal mats ML0~ML15. The second mat group 120 may include a plurality of second normal mats. Similarly, in the present embodiment, it may be assumed that the second mat group 120 may also include sixteen second normal mats, that is, first to sixteenth right normal mats MR0~MR15.

The first mat group 110 may include the first ECC mat ECC_ML and the first redundancy mat R_ML. The second mat group 120 may include the second ECC mat ECC_MR and the second redundancy mat R_MR. The first ECC mat ECC_ML may be used to store parity data which are used for the execution of an error correction operation for the first normal mats ML0~ML15 in the first mat group 110. The second ECC mat ECC_MR may be used to store parity data which are used for the execution of an error correction operation for the second normal mats MR0~MR15 in the second mat group 120. When no error correction operation is performed by the memory device 10, the first and second ECC mats ECC_ML and ECC_MR may be excluded from respective ones of the first and second mat groups 110 and 120. The first redundancy mat R_ML may be used to perform a repair operation for the first normal mats ML0~ML15 and the first ECC mat ECC_ML disposed in the first mat group 110. The second redundancy mat R_MR may be used to perform a repair operation for the second normal mats MR0~MR15 and the second ECG mat ECC_MR disposed in the second mat group 120.

The first normal mats ML0~ML15, the first ECG mat ECC_ML, and the first redundancy mat R_ML may be configured such that the same row line is selected by one first active command and one first row address. Similarly, the second normal mats MR0~MR15, the second ECG mat ECC_MR, and the second redundancy mat R_MR may be configured such that the same row line is selected by one second active command and one second row address.

Referring to FIG. 3, each of the first normal mats ML0~ML15, the first ECC mat ECC_ML, and the first redundancy mat R_ML may include the same number of row lines, for example, first to $1024^{th}$ row lines R0~R1023. Although the first to $1024^{th}$ row lines R0~R1023 are illustrated in the first mat group 110 of the memory device 10 according to the present embodiment, the present embodiment may be merely an example of the present disclosure. Thus, in some other embodiments, the number of the row lines disposed in the first mat group 110 may be less or greater than 1024. The first normal mats ML0~ML15, the first ECC mat ECC_ML, and the first redundancy mat R_ML may share the first to $1024^{th}$ row lines R0~R1023 with each other. That is, one of the first to $1024^{th}$ row lines R0~R1023 disposed in each of the first normal mats ML0~ML15, the first ECC mat ECC_ML, and the first redundancy mat R_ML may be selected by one row address. For example, the first row R0, which is disposed in the first normal mats ML0~ML15, the first ECC mat ECC_ML, and the first redundancy mat may be selected by a first row address, may be activated by a first active control signal, and may be accessed by a read signal or a write signal.

In the present embodiment, it may be assumed that the first normal mats ML0~ML15 in the first mat group 110 have a page size of one kilobyte (Kbyte) and the second normal mats MR0~MR15 in the second mat group 120 also have a page size of one Kbyte. In such a case, the first normal mats ML0~ML15 in the first mat group 110 may include 1024 column lines YIs. Accordingly, each of the first normal mats ML0~ML15 may include 64 column lines (i.e., first to $64^{th}$ column lines YI0~YI63). The first ECC mat ECC_ML may include the same number of column lines (i.e., first to $64^{th}$ column lines YI0~YI63) as each of the first normal mats ML0~ML15. Meanwhile, the number of column lines included in the first redundancy mat R_ML may be less than the number of the column lines included in each of the first normal mats ML0~ML15. For example, the first redundancy mat R_ML may include 32 redundancy column lines (i.e., first to $32^{nd}$ redundancy column lines RYI0~RYI31). In an embodiment, the total number of column lines included in the first and second redundancy mats R_ML an R_MR may be equal to the number of column lines included in each of the first normal mats ML0~ML15.

A repair operation using the first redundancy mat R_ML may be performed in units of column lines. That is, each of the redundancy column lines RYI0~RYI31 in the first redundancy mat R_ML may replace any one failed column line among the column lines YI0~YI63 in the first normal mats ML0~ML15 and the column lines YI0~YI63 in the first ECC mat ECC_ML. Thus, main memory cells coupled to 32 column lines among the column lines included in the first normal mats ML0~ML15 and the first ECC mat ECC_ML may be repaired using the redundant memory cells coupled to the first to $32^{nd}$ redundancy column lines RYI0~RYI31 of the first redundancy mat R_ML. When a burst length is "N" (where, "N" is a natural number), (16×N)-bit data may be output from the first normal mats ML0~ML15 and the first redundancy mat R_ML in response to one read (or write) command and one column address. In addition, "N"-bit parity data may also be output from the first ECC mat ECC_ML. In an embodiment, when the burst length is "8", 128-bit data may be output from the first normal mats ML0~ML15 and the first redundancy mat R_ML in response to one read (or write) command and one column address. In addition, 8-bit parity data may also be output from the first ECC mat ECC_ML.

Referring again to FIG. 2, the first normal mats ML0~ML15 may include first bit line sense amplifiers (i.e., first to $16^{th}$ left bit line sense amplifiers BLSAL0~BLSAL15), respectively. The first ECC mat ECC_ML may include a first ECC bit line sense amplifier ECC_BLSAL. The first redundancy mat may include a first redundancy bit line sense amplifier R_BLSAL. Each of the first bit line sense amplifiers BLSAL0~BLSAL15 may perform a sensing operation for amplifying a voltage difference between a voltage level of a selected bit line of any one of the first normal mats ML0~ML15 and a voltage level of a complementary bit line. The first ECC bit line sense amplifier ECC_BLSAL may perform a sensing operation for amplifying a voltage difference between a voltage level of a selected bit line of the first ECC mat ECC_ML and a voltage level of a complementary bit line. The first redundancy bit line sense amplifier R_BLSAL may perform a sensing operation for amplifying a voltage difference between a voltage level of a selected bit line of the first redundancy mat R_ML and a voltage level of a complementary bit line.

The second normal mats MR0~MR15 may include second bit line sense amplifiers (i.e., first to $16^{th}$ right bit line sense amplifiers BLSAR0~BLSAR15), respectively. The second ECC mat ECC_NIR may include a second ECC bit line sense amplifier ECC_BLSAR. The second redundancy mat R_MR may include a second redundancy bit line sense amplifier R_BLSAR. Each of the second bit line sense amplifiers BLSAR0~BLSAR15 may perform a sensing operation for amplifying a voltage difference between a voltage level of a selected bit line of any one of the second normal mats MR0~MR15 and a voltage level of a complementary bit line. The second ECC bit line sense amplifier ECC_BLSAR may perform a sensing operation for amplifying a voltage difference between a voltage level of a selected bit line of the second ECC mat ECC_MR and a voltage level of a complementary bit line. The second redundancy bit line sense amplifier R_BLSAR may perform a sensing operation for amplifying a voltage difference between a voltage level of a selected bit line of the second redundancy mat R_MR and a voltage level of a complementary bit line.

The memory device 10 according to the present embodiment may include data I/O lines, for example, segmented I/O lines (SIOs) 210_0~210_16, 220_0~220_16, and 230, local I/O lines (LIOs) 310_0~310_16, 320_0~320_16, and 330, enhanced I/O lines (EIOs) 410_0~410_16 and 420_0~420_16, and a global I/O line (GIO) 500. During a data read operation of the memory device 10, read data in the memory device 10 may be output from the memory device 10 through the segmented I/O lines (SIGs), the local I/O lines (LIOs), the enhanced I/O lines (EIOs), and the global I/O line (GIO). In contrast, during a data write operation of the memory device 10, write data input to the memory device 10 may be transmitted to the first and second mat groups 110 and 120 through the global I/O line (GIO), the enhanced I/O lines (EIOs), the local I/O lines (LIOs), and the segmented I/O lines (SIOs). As used herein, the tilde "~" indicates a range of components. For example, "210_0~210_16" indicates the SIOs 210_0, 210_1, . . . , and 210_16 shown in FIG. 2.

The segmented I/O lines (SIOs) may include a plurality of first segmented I/O lines 210_0~210_16, a plurality of second segmented I/O lines 220_0~220_16, and redundancy segmented I/O line 230. The first segmented I/O lines 210_0~210_16 may be allocated to the first normal mats ML0~ML15 and the first ECC mat ECC_ML, respectively. The second segmented I/O lines 220_0~220_16 may be allocated to the second normal mats MR0~MR15 and the second ECC mat ECC_MR, respectively. The redundancy segmented I/O line 230 may be allocated to both of the first redundancy mat R_ML and the second redundancy mat R_MR.

The first segmented I/O lines 210_0~210_15 may be coupled to the first bit line sense amplifiers BLSAL0~BLSAL15 of the first normal mats ML0~ML15, respectively. The first segmented I/O line 210_16 (also, referred to as a first ECC segmented I/O line 210_16) may be coupled to the first ECC bit line sense amplifier ECC_BLSAL. The second segmented I/O lines 220_0~220_15 may be coupled to the second bit line sense amplifiers BLSAR0~BLSAR15 of the second normal mats MR0~MR15, respectively. The second segmented I/O line 220_16 (also, referred to as a second ECC segmented I/O line 220_16) may be coupled to the second ECC bit line sense amplifier ECC_BLSAR. The redundancy segmented I/O line 230 may be coupled to both of the first redundancy bit line sense amplifier R_BLSAL in the first redundancy mat R_ML and the second redundancy bit line sense amplifier R_BLSAR in the second redundancy mat R_MR.

When the memory device 10 performs the data read operation, the read data sensed by the first bit line sense amplifiers BLSAL0~BLSAL15 of the first normal mats ML0~ML15 may be transmitted through the first segmented I/O lines 210_0~210_15. For example, the read data sensed by the first one BLSAL0 of the first bit line sense amplifiers BLSAL0~BLSAL15 may be transmitted through the first one 210_0 of the first segmented I/O lines 210_0~210_15. Similarly, the read data sensed by the second one BLSAL1 of the first bit line sense amplifiers BLSAL0~BLSAL15 may be transmitted through the second one 210_1 of the first segmented I/O lines 210_0~210_15. In the same way, the read data sensed by the sixteenth one BLSAL15 of the first bit line sense amplifiers BLSAL0~BLSAL15 may be transmitted through the sixteenth one 210_15 of the first segmented I/O lines 210_0~210_15. The parity data sensed by the first ECC bit line sense amplifier ECC_BLSAL may be transmitted through the first ECC segmented I/O line 210_16.

Moreover, the read data sensed by the second bit line sense amplifiers BLSAR0~BLSAR15 of the second normal mats MR0~MR15 may be transmitted through the second segmented I/O lines 220_0~220_15 when the memory device 10 performs the data read operation. For example, the read data sensed by the first one BLSAR0 of the second bit line sense amplifiers BLSAR0~BLSAR15 may be transmitted through the first one 220_0 of the second segmented I/O lines 220_0~220_15. Similarly, the read data sensed by the second one BLSAR1 of the second bit line sense amplifiers BLSAR0~BLSAR15 may be transmitted through the second one 220_1 of the second segmented I/O lines 220_0~220_15. In the same way, the read data sensed by the sixteenth one BLSAR15 of the second bit line sense amplifiers BLSAR0~BLSAR15 may be transmitted through the sixteenth one 220_15 of the second segmented I/O lines 220_0~220_15. The parity data sensed by the second ECC bit line sense amplifier ECC_BLSAR may be transmitted through the second ECC segmented I/O line 220_16.

The read data sensed by the first redundancy bit line sense amplifier R_BLSAL of the first redundancy mat R_ML may be transmitted through the redundancy segmented I/O line 230. In addition, the read data sensed by the second redundancy bit line sense amplifier R_BLSAR of the second redundancy mat R_MR may also be transmitted through the redundancy segmented I/O line 230. That is, the first redundancy mat R_ML and the second redundancy mat R_MR may share the redundancy segmented I/O line 230 with each other.

In the present embodiment, the number of the redundancy column lines in each of the first and second redundancy mats R_ML and R_MR may be less than the number of the column lines in each of the normal mats ML0~ML15 and MR0~MR15. In such a case, a layout area of the segmented I/O lines allocated to the first redundancy mat R_ML may be less than a layout area of the segmented I/O lines allocated to each of the normal mats ML0~ML15 and MR0~MR15, and a layout area of the segmented I/O lines allocated to the second redundancy mat R_MR may also be less than the layout area of the segmented I/O lines allocated to each of the normal mats ML0~ML15 and MR0~MR15. According to the present embodiment, both of the first and second redundancy bit line sense amplifiers R_BLSAL and R_BLSAR may receive or output data through the redundancy segmented I/O line 230. That is, one redundancy segmented I/O line may be disposed in an area having a total pitch size of the first and second redundancy mats R_ML and R_MR. Thus, it may be possible to enhance the design flexibility of the redundancy segmented I/O line allocated to the first and second redundancy mats R_ML and R_MR.

The local I/O lines LIOs may include a plurality of first local I/O lines 310_0~310_16, a plurality of second local I/O lines 320_0~320_16, and a redundancy local I/O line 330. The first local I/O lines 310_0~310_16 may be allocated to the first normal mats ML0~ML15 and the first ECC mat ECC_ML, respectively. The second local I/O lines 320_0~320_16 may be allocated to the second normal mats MR0~MR15 and the second ECC mat ECC_MR, respectively. The redundancy local I/O line 330 may be allocated to both of the first and second redundancy mats R_ML and R_MR.

The enhanced I/O lines EIOs may include a plurality of first enhanced I/O lines 410_0~410_16 and a plurality of second enhanced I/O lines 420_0~420_16. The first enhanced I/O lines 410_0~410_16 may be allocated to the first normal mats ML0~ML15 and the first ECC mat ECC_ML, respectively. The second enhanced I/O lines 420_0~420_16 may be allocated to the second normal mats MR0~MR15 and the second ECC mat ECC_MR, respectively.

The memory device 10 according to the present embodiment may include various control circuits. The various control circuits of the memory device 10 may include I/O switches and I/O sense amplifier/write driver circuits IOSA/WRDRVs. The I/O switches may include a plurality of first I/O switches (e.g., first to sixteenth left I/O switches IOSWL0~IOSWL15), a first ECC I/O switch ECC_IOSWL, a plurality of second I/O switches (e.g., first to sixteenth right I/O switches IOSWR0~IOSWR15), a second ECC I/O switch ECC_IOSWR, and a redundancy I/O switch RED_IOSW.

The first I/O switches IOSWL0~IOSWL15 may be disposed between the first segmented I/O lines 210_0~210_15 and the first local I/O lines 310_0~310_15. The second I/O switches IOSWR0~IOSWR15 may be disposed between the second segmented I/O lines 220_0~220_15 and the second local I/O lines 320_0~320_15. The first ECC I/O switch ECC_IOSWL may be disposed between the first ECC segmented I/O line 210_16 and the first local I/O line 310_16 (also, referred to as a first ECC local I/O line 310_16). The second ECC I/O switch ECC_IOSWR may be disposed between the second ECC segmented I/O line 220_16 and the second local I/O line 320_16 (also, referred to as a second ECC local I/O line 320_16). The redundancy I/O switch RED_IOSW may be disposed between the redundancy segmented I/O line 230 and the redundancy local I/O line 330.

The first I/O switches IOSWL0~IOSWL15 may be allocated to the first normal mats ML0~ML15, respectively. The second I/O switches IOSWR0~IOSWR15 may be allocated to the second normal mats MR0~MR15, respectively. The first ECC I/O switch ECC_IOSWL may be allocated to the first ECC mat ECC_ML. The second ECC I/O switch ECC_IOSWR may be allocated to the second ECC mat ECC_MR. The redundancy I/O switch RED_IOSW may be allocated to both of the first redundancy mat R_ML and the second redundancy mat R_MR.

The first I/O switches IOSWL0~IOSWL15 may perform a switching operation for connecting the first segmented I/O lines 210_0~210_15 to the first local I/O lines 310_0~310_15 or for disconnecting the first segmented I/O lines 210_0~210_15 from the first local I/O lines 310_0~310_15 and may perform a shifting operation of output lines. The first ECC I/O switch ECC_IOSWL may perform a switching operation for connecting the first ECC segmented I/O line 210_16 to the first ECC local I/O line 310_16 or for disconnecting the first ECC segmented I/O line 210_16 from the first ECC local I/O line 310_16 and may perform a shifting operation of an output line. The second I/O switches IOSWR0~IOSWR15 may perform a switching operation for connecting the second segmented I/O lines 220_0~220_15 to the second local I/O lines 320_0~320_15 or for disconnecting the second segmented I/O lines 220_0~220_15 from the second local I/O lines 320_0~320_15 and may perform a shifting operation of output lines. The second ECC I/O switch ECC_IOSWR may perform a switching operation for connecting the second ECC segmented I/O line 220_16 to the second ECC local I/O line 320_16 or for disconnecting the second ECC segmented I/O line 220_16 from the second ECC local I/O line 320_16 and may perform a shifting operation of an output line. The redundancy I/O switch RED_IOSW may perform a switching operation for connecting the redundancy segmented I/O line 230 to the redundancy local I/O line 330 or for disconnecting the redundancy segmented I/O line 230 from the redundancy local I/O line 330 and may perform a shifting operation of an output line.

Although not shown in the drawings the memory device 10 may further include a segmented I/O line pre-charge circuit for pre-charging the first segmented I/O lines 210_0~210_15, the first ECC segmented I/O line 210_16, the second segmented I/O lines 220_0~220_15, the second ECC segmented I/O line 220_16, and the redundancy segmented I/O line 230. In addition, the memory device 10 may also include a local sense amplifier for amplifying voltage levels of the first segmented I/O lines 210_0~210_15, the first ECC segmented I/O line 210_16, the second segmented I/O lines 220_0~220_15, the second ECC segmented I/O line 220_16, and the redundancy segmented I/O line 230.

Data loaded on the first segmented I/O lines 210_0~210_15 may be transmitted to I/O sense amplifiers IOSA allocated to respective ones of the first normal mats ML0~ML15 through the first I/O switches IOSWL0~IOSWL15 and the first local I/O lines 310_0~310_15. Similarly, data loaded on the second segmented I/O lines 220_0~220_15 may be transmitted to I/O sense amplifiers IOSA allocated to respective ones of the second normal mats MR0~MR15 through the second I/O switches IOSWR0~IOSWR15 and the second local I/O lines 320_0~320_15.

Data loaded on the first ECC segmented I/O line 210_16 may be transmitted to an I/O sense amplifier IOSA allocated to the first ECC mat ECC_ML through the first ECC I/O switch ECC_IOSWL and the first ECC local I/O line 310_16. Similarly, data loaded on the second ECC segmented I/O line 220_16 may be transmitted to an I/O sense amplifier IOSA allocated to the second ECC mat ECC_MR through the second ECC I/O switch ECC_IOSWR and the second ECC local I/O line 32016. In addition, data loaded on the redundancy segmented I/O line 230 may be transmitted to an I/O sense amplifier IOSA allocated to both of the first redundancy mat R_ML and the second redundancy mat R_MR through the redundancy I/O switch RED_IOSW and the redundancy local I/O line 330.

Each of the I/O sense amplifier/write driver circuits IOSA/WRDRVs may include an I/O sense amplifier IOSA and a write driver WRDRV. The I/O sense amplifiers IOSAs may amplify the data transmitted through the local I/O lines to output the amplified data to the global I/O line 500 through the enhanced I/O lines when the memory device 10 performs the data read operation. For example, when the memory device 10 performs the data read operation, data loaded on the first local I/O lines 310_0~310_16 may be amplified by the I/O sense amplifiers IOSAs and the amplified data may be transmitted to the global I/O line 500 through the first enhanced I/O lines 410_0~410_16. Similarly, when the memory device 10 performs the data read operation, data loaded on the second local I/O lines 320_0~320_16 may be amplified by the I/O sense amplifiers IOSAs and the amplified data may be transmitted to the global I/O line 500 through the second enhanced I/O lines 420_0~420_16.

When the memory device 10 performs the data read operation, read data output from the first redundancy mat R_ML may be amplified by the I/O sense amplifier IOSA allocated to the first ECC mat ECC_ML. In the event that the first ECC mat ECC_ML is absent from the first mat group 110, the read data output from the first redundancy mat R_ML may be amplified by an I/O sense amplifier IOSA allocated to the first normal mat the sixteenth left normal mat ML15), which is closest to the first redundancy mat R_ML, among the first normal mats ML0~ML15. Similarly, when the memory device 10 performs the data read operation, read data output from the second redundancy mat R_MR may be amplified by the I/O sense amplifier IOSA allocated to the second ECC mat ECC_MR. In the event that the second ECC mat ECC_MR is absent from the second mat group 120, the read data output from the second redundancy mat R_MR may be amplified by an I/O sense amplifier IOSA allocated to the second normal mat (i.e., the sixteenth right normal mat MR15), which is closest to the second redundancy mat R_MR, among the second normal mats MR0~MR15. In an embodiment, the I/O sense amplifier IOSA allocated to both of the first and second redundancy mats R_ML and R_MR may be used only during a parallel test operation for the memory device 10.

When the memory device 10 performs the data write operation, the write drivers WRDRVs may receive and transmit write data, which are input to the memory device 10 through the global I/O line 500 and the first and second enhanced I/O lines 410_0~410_16 and 420_0~420_16, to the first and second local I/O lines 310_0~310_16 and 320_0~320_16 and the redundancy local I/O line 330. During the data write operation for writing the write data into the first normal mats ML0~ML15, the write driver WRDRV allocated to both of the first and second redundancy mats R_ML and R_MR may receive the write data through the first enhanced I/O line 410_16 allocated to the first ECC mat ECC_ML. In the event that the first ECC mat ECC_ML is absent from the first mat group 110, the write driver WRDRV allocated to both of the first and second redundancy mats R_ML and R_MR may receive the write data through the first enhanced I/O line 410_15 allocated to the first normal mat (i.e., the sixteenth left normal mat which is closest to the first redundancy mat R_ML, among the first normal mats ML0~ML15.

Similarly, during the data write operation for writing the write data into the second normal mats MR0~MR15, the write driver WRDRV allocated to both of the first and second redundancy mats R_ML and R_MR may receive the write data through the second enhanced I/O line 420_16 allocated to the second ECC mat ECC_MR. In the event that the second ECC mat ECC_MR is absent from the second mat group 120, the write driver WRDRV allocated to both of the first and second redundancy mats R_ML and R_MR may receive the write data through the second enhanced I/O line 420_15 allocated to the second normal mat (i.e., the sixteenth right normal mat MR15), which is closest to the second redundancy mat R_MR, among the second normal mats MR0~MR15.

After the repair operation of the memory device 10 is performed using the first redundancy mat R_ML or the second redundancy mat R_MR in units of columns, a data I/O operation of the memory device 10 may be performed using a shifted path. In order to provide the shifted path during the data read operation of the memory device 10, the memory device 10 may include first shift local I/O lines 350_0~350_15, a first shift redundancy local I/O line 380_1, second shift local I/O lines 360_0~360_15, and a second shift redundancy local I/O line 380_2. In addition, in order to provide the shifted path during the data write operation of the memory device 10, the memory device 10 may include first shift enhanced I/O lines 450_0~450_15, a first shift redundancy enhanced I/O line 480_1, second shift enhanced I/O lines 460_0~460_15, and a second shift redundancy enhanced I/O line 480_2.

The first shift local I/O lines 350_0~350_14 may be disposed between the first I/O switches IOSWL1~IOSWL15 allocated to the second to sixteenth left normal mats ML1~ML15 and the I/O sense amplifier/write driver circuits IOSA/WRDRVs allocated to the first to fifteenth left normal mats ML0~ML14. Thus, the read data output from the $H^{th}$ left normal mat ML(H-1) may be shifted and transmitted to the I/O sense amplifier IOSA allocated to the $(H-1)^{th}$ left normal mat ML(H-2) through the $H^{th}$ left I/O switches IOSWL(H-1) and the first shift local I/O line 350_(H-2) (where, "H" is one of the natural numbers from "2" to "16"). For example, the read data output from the second left normal mat ML1 may be shifted and transmitted to the I/O sense amplifier IOSA allocated to the first left normal mat ML0 through the second left I/O switch IOSWL1 and the first shift local I/O line 350_0.

The first shift local I/O line 350_15 may be disposed between the first ECC I/O switch ECC_IOSWL allocated to the first ECC mat ECC_ML and the I/O sense amplifier/write driver circuit IOSA/WRDRV allocated to the last left normal mat the sixteenth left normal mat ML15). Thus, parity data output from the first ECC mat ECC_ML may be shifted and transmitted to the I/O sense amplifier IOSA allocated to the sixteenth left normal mat ML15 through the first ECC I/O switch ECC_IOSWL and the first shift local I/O line 350_15.

The first shift redundancy local I/O line 380_1 may be disposed between the redundancy I/O switch RED_IOSW allocated to both of the first and second redundancy mats R_ML and R_MR and the I/O sense amplifier/write driver circuit IOSA/WRDRV allocated to the first ECC mat ECC_ML. Thus, read data output from the first redundancy mat R_ML may be shifted and transmitted to the I/O sense amplifier IOSA allocated to the first ECC mat ECC_ML through the redundancy I/O switch RED_IOSW and the first shift redundancy local I/O line 380_1. In the event that the first ECC mat ECC_ML is absent from the first mat group 110, the first shift redundancy local I/O line 380_1 may be disposed between the redundancy I/O switch RED_IOSW allocated to both of the first and second redundancy mats R_ML and R_MR and the I/O sense amplifier/write driver circuit IOSA/WRDRV allocated to the sixteenth left normal mat ML15, which is closest to the first redundancy mat R_ML, among the first normal mats ML0~ML15.

The second shift local I/O lines 360_0~360_14 may be disposed between the second I/O switches IOSWR1~IOSWR15 allocated to the second to sixteenth right normal mats MR1~MR15 and the I/O sense amplifier/write driver circuits IOSA/WRDRVs allocated to the first to fifteenth right normal mats MR0~MR14. Thus, the read data output from the $H^{th}$ right normal mat MR(H-1) may be shifted and transmitted to the I/O sense amplifier IOSA allocated to the $(H-1)^{th}$ right normal mat MR(H-2) through the $H^{th}$ right I/O switches IOSWR(H-1) and the second shift local I/O line 360_(H-2) (where, "H" is one of the natural numbers from "2" to "16"). For example, the read data output from the second right normal mat MR1 may be shifted and transmitted to the I/O sense amplifier IOSA allocated to the first right normal mat MR0 through the second right I/O switch IOSWR1 and the second shift local I/O line 360_0.

The second shift local I/O line 360_15 may be disposed between the second ECC I/O swatch ECC_IOSWR allocated to the second ECC mat ECC_MR and the I/O sense amplifier/write driver circuit IOSA/WRDRV allocated to the last right normal mat (i.e., the sixteenth right normal mat MR15). Thus, parity data output from the second ECC mat ECC_MR may be shifted and transmitted to the I/O sense amplifier IOSA allocated to the sixteenth right normal mat MR15 through the second ECC I/O switch ECC_IOSWR and the second shift local I/O line 360_15.

The second shift redundancy local I/O line 380_2 may be disposed between the redundancy I/O switch RED_IOSW allocated to both of the first and second redundancy mats R_ML and R_MR and the I/O sense amplifier/write driver circuit IOSA/WRDRV allocated to the second ECC mat ECC_MR. Thus, read data output from the second redundancy mat R_MR may be shifted and transmitted to the I/O sense amplifier IOSA allocated to the second ECC mat ECC_MR through the redundancy I/O switch RED_IOSW and the second shift redundancy local I/O line 380_2. In the event that the second ECC mat ECC_MR is absent from the second mat group 120, the second shift redundancy local I/O line 380_2 may be disposed between the redundancy I/O switch RED_IOSW allocated to both of the first and second redundancy mats R_ML and R_MR and the I/O sense amplifier/write driver circuit IOSA/WRDRV allocated to the sixteenth right normal mat MR15, which is closest to the second redundancy mat R_MR, among the second normal mats MR0~MR15.

The first shift enhanced I/O lines 450_0~450_14 may be disposed between the I/O sense amplifier/write driver circuits IOSA/WRDRVs allocated to the first to sixteenth left normal mats ML0~ML15 and the global I/O line 500. Each of the first shift enhanced I/O lines 450_0~450_14 may be used to shift a write data transmission path for a certain first normal mat of the first normal mats ML0~ML14 to another write data transmission path for another first normal mat adjacent to the certain first normal mat of the first normal mats ML0~ML14. For example, write data to be written into the $(H-1)^{th}$ left normal mat ML(H-2) may be shifted and transmitted to the write driver WRDRV allocated to the $H^{th}$ left normal mat ML(H-1) through the global I/O line 500 and the first shift enhanced I/O line 450_(H-2) (where, "H" is one of the natural numbers from "2" to "16"). Thus, the write data to be written into the (H-1) left normal mat ML(H-2) may be transmitted to the $H^{th}$ left normal mat ML(H-1) instead of the $(H-1)^{th}$ left normal mat ML(H-2). For example, the write data to be written into the first left normal mat ML0 may be shifted and transmitted to the write driver WRDRV allocated to the second left normal mat ML1 through the global I/O line 500 and the first shift enhanced I/O line 450_0. Accordingly, the write data to be written into the first left normal mat ML0 may be transmitted to the second left normal mat ML1 through the first local I/O line 310_1, the first I/O switch IOSWL1, and the first segmented I/O line 210_1.

The first shift enhanced I/O line 450_15 may be disposed between the I/O sense amplifier/write driver circuit IOSA/WRDRV allocated to the first ECC mat ECC_ML and the global I/O line 500. The first shift enhanced I/O line 450_15 may be used to shift a write data transmission path for the sixteenth left normal mat ML15 to another write data transmission path for the first ECC mat ECC_ML. For example, write data to be written into the sixteenth left normal mat ML15 may be shifted and transmitted to the write driver WRDRV allocated to the first ECC mat ECC_ML through the global I/O line 500 and the first shift enhanced I/O line 450_15. In the event that the first ECC mat ECC_ML is absent from the first mat group 110, the first shift enhanced I/O line 450_15 may be replaced with the first shift redundancy enhanced I/O line 480_1.

The first shift redundancy enhanced I/O line 480_1 may be disposed between the I/O sense amplifier/write driver circuit IOSA/WRDRV allocated to the first ECC mat ECC_ML and a parity generation circuit (not shown). In an embodiment, the parity generation circuit may be an ECC encoder included in a general ECC circuit. Thus, the parity data to be input to the first ECC mat ECC_ML may be transmitted to the write driver WRDRV allocated to the first redundancy mat R_ML through the first shift redundancy enhanced I/O line 480_1. In the event that the first ECC mat ECC_ML is absent from the first mat group 110, the first shift redundancy enhanced I/O line 480_1 may be disposed between the global I/O line 500 and the I/O sense amplifier/write driver circuit IOSA/WRDRV allocated to the sixteenth left normal mat ML15, which is closest to the first redundancy mat R_ML, among the first normal mats ML0~ML15.

The second shift enhanced I/O lines 460_0~460_14 may be disposed between the I/O sense amplifier/write driver circuits IOSA/WRDRVs allocated to the first to sixteenth right normal mats MR0~MR15 and the global I/O line 500. Each of the second shift enhanced I/O lines 460_0~460_14 may be used to shift a write data transmission path for a certain second normal mat of the second normal mats MR0~MR14 to another write data transmission path for another second normal mat adjacent to the certain second normal mat of the second normal mats MR0~MR14. For example, write data to be written into the $(H-1)^{th}$ right normal mat MR(H-2) may be shifted and transmitted to the write driver WRDRV allocated to the $H^{th}$ right normal mat MR(H-1) through the global I/O line 500 and the second shift enhanced I/O line 460_(H-2) (where, "H" is one of the natural numbers from "2" to "16"). Thus, the write data to be written into the $(H-1)^{th}$ left normal mat MR(H-2) may be transmitted to the $H^{th}$ right normal mat MR(H-1) instead of the $(H-1)^{th}$ right normal mat MR(H-2). For example, the write data to be written into the first right normal mat MR0 may be shifted and transmitted to the write driver WRDRV allocated to the second right normal mat MR1 through the global I/O line 500 and the second shift enhanced I/O line 460_0. Accordingly, the write data to be written into the first right normal mat MR0 may be transmitted to the second right nor gal mat MR1 through the second local I/O line 320_1, the second I/O switch IOSWR1, and the second segmented I/O line 220_1.

The second shift enhanced I/O line 460_15 may be disposed between the I/O sense amplifier/write driver circuit IOSA/WRDRV allocated to the second ECC mat ECC_MR and the global I/O line 500. The second shift enhanced I/O line 460_15 may be used to shift a write data transmission path for the sixteenth right normal mat MR15 to another write data transmission path for the second ECC mat ECC_MR. For example, write data to be written into the sixteenth right normal mat MR15 may be shifted and transmitted to the write driver WRDRV allocated to the second ECC mat ECC_MR through the global I/O line 500 and the second shift enhanced I/O line 460_15. In the event that the second ECC mat ECC_MR is absent from the second mat group 120, the second shift enhanced I/O line 460_15 may be replaced with the second shift redundancy enhanced I/O line 480_2.

The second shift redundancy enhanced I/Oline 480_2 may be disposed between the I/O sense amplifier/write driver circuit IOSA/WRDRV allocated to the second ECC mat ECC_MR and a parity generation circuit (not shown). In an embodiment, the parity generation circuit may be an ECC encoder included in a general ECC circuit. Thus, the parity data to be input to the second ECC mat ECC_MR may be transmitted to the write driver WRDRV allocated to the second redundancy mat R_MR through the second shift redundancy enhanced I/O line 480_2. In the event that the second ECC mat ECC_MR is absent from the second mat group 120, the second shift redundancy enhanced I/O line 480_2 may be disposed between the global I/O line 500 and the I/O sense amplifier/write driver circuit IOSA/WRDRV allocated to the sixteenth right normal mat MR15, which is closest to the second redundancy mat R_MR, among the second normal mats MR0~MR15.

Figure 4:
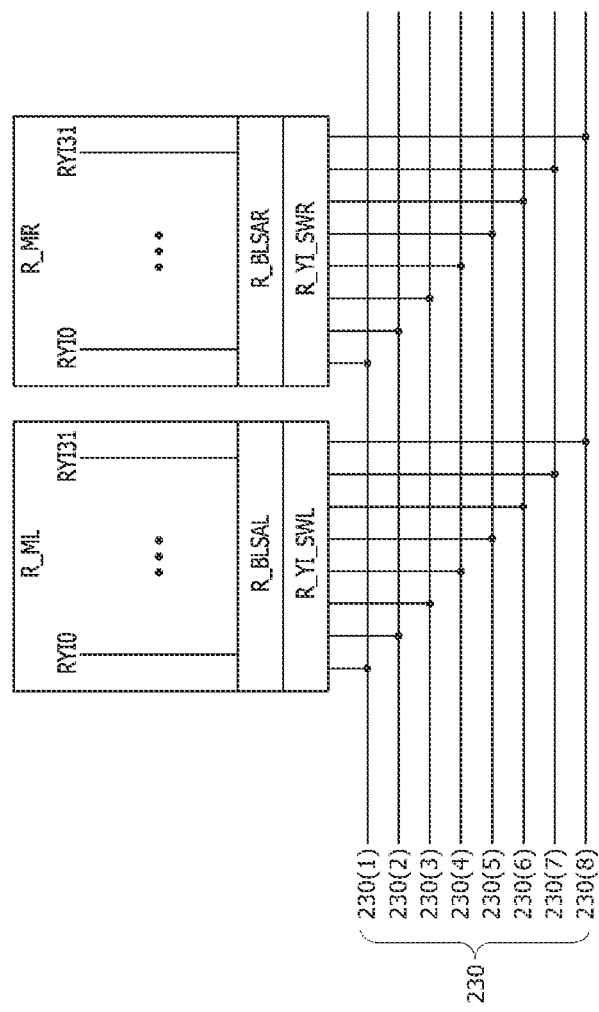
FIG. 4 illustrates first and second redundancy mats included in the memory device of FIG. 2 and a redundancy segmented I/O line connected to the first and second redundancy mats.

FIG. 4 illustrates the first and second redundancy mats R_ML and R_MR included in the memory device 10 of FIG. 2 and the redundancy segmented I/O line 230 connected to the first and second redundancy mats R_ML and R_MR. In the present embodiment, it may be assumed that data loaded on eight column lines are output by one column address (i.e., the burst length is "8"). In such a case, the redundancy segmented I/O line 230 may include eight lines, that is, first to eighth redundancy segmented I/O lines 230(1)~230(8) corresponding to eight bits. Referring to FIG. 4, the first to eighth redundancy segmented I/O lines 230(1)~230(8) may be coupled to each of the first and second redundancy mats R_ML and R_MR. Although each of the first to eighth redundancy segmented I/O lines 230(1)~230(8) is illustrated as one line in FIG. 4, each of the first to eighth redundancy segmented I/O lines 230(1)~230(8) may be comprised of a pair of lines including a bit line and a complementary bit line.

Redundancy column lines, which are designated by a column address, among the redundancy column lines coupled to the first redundancy bit line sense amplifier R_BLSAL of the first redundancy mat R_ML may be coupled to the first to eighth redundancy segmented I/O lines 230(1)~230(8) through a first column switch circuit R_YI_SWL. The first column switch circuit R_YI_SWL may include a plurality of first column MOS transistors for switching on or off the connections between the redundancy column lines RYI0~RYI31 of the first redundancy mat R_ML and the redundancy segmented I/O line 230. Redundancy column lines, which are designated by a column address, among the redundancy column lines coupled to the second redundancy bit line sense amplifier R_BLSAR of the second redundancy mat R_MR may be coupled to the first to eighth redundancy segmented I/O lines 230(1)~230(8) through a second column switch circuit R_YI_SWR. The second column switch circuit R_YI_SWR may include a plurality of second column MOS transistors for switching on or off the connections between the redundancy column lines RYI0~RYI31 of the second redundancy mat R_MR and the redundancy segmented I/O line 230.

During a first access operation for accessing to the first mat group (110 of FIG. 2), the first to eighth redundancy segmented I/O lines 230(1)~230(8) may provide data transmission paths between the first redundancy mat R_ML of the first mat group (110 of FIG. 2) and the redundancy local I/O line 330. In addition, during a second access operation for accessing to the second mat group (120 of FIG. 2), the first to eighth redundancy segmented I/O lines 230(1)~230(8) may provide data transmission paths between the second redundancy mat R_MR of the second mat group (120 of FIG. 2) and the redundancy local I/O line 330. In an embodiment, the first access operation and the second access operation may be sequentially executed.

The memory device 10 according to the present embodiment may perform the repair operations and the access operations in a plurality of repair modes. In an embodiment, the plurality of repair modes may include first to third repair modes. The first repair mode may be a repair mode in which a first failed column line in one of the normal mats is replaced with a redundancy column line corresponding to the failed column line among the redundancy column lines of the redundancy mats. The second repair mode may be executed when a redundancy column line corresponding to a second failed column line in one of the normal mats is in use due to the first repair mode. In such a case, the second repair mode may be executed such that the second failed column line is replaced with another column line in the same normal mat. The third repair mode may be executed when a redundancy column line corresponding to a third failed column line in one of the normal mats is in use due to the previous repair mode and a fuse allocated to the normal mat including the third failed column line is in use due to the previous repair mode. In such a case, the third repair mode may be executed such that the third failed column is replaced with another column line in the same normal mat. In order to perform the repair operations in the first to third repair modes, the memory device 10 may be designed to include a first fuse circuit and a second fuse circuit.

Figure 5:
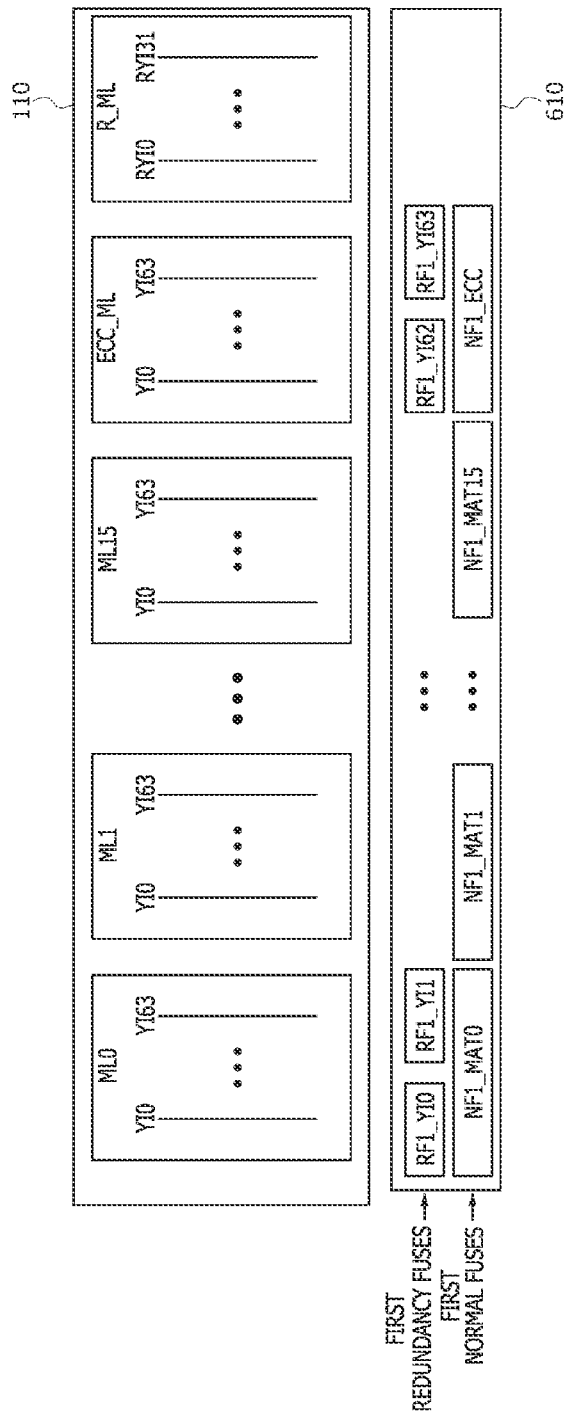
FIG. 5 illustrates an example of a first fuse circuit for repair processes according to first to third repair modes of first normal mats and a first ECC mat which are included in the memory device shown in FIG. 2.

FIG. 5 illustrates an example of a first fuse circuit 610 for the repair operations according to first to third repair modes of the first normal mats ML0~ML15 and the first ECC mat ECC_ML which are included in the memory device 10 shown in FIG. 2. Referring to FIG. 5, the memory device 10 may include the first fuse circuit 610 allocated to the first mat group 110. The first fuse circuit 610 may include a plurality of first redundancy fuses (e.g., first to $64^{th}$ left redundancy fuses RF1_YI0~RF1_YI63) and a plurality of first normal fuses (e.g., first to $17^{th}$ left normal fuses NF1_MAT0~NF1_MAT15 and NF1_ECC). The first redundancy fuses RF1_YI0~RF1_YI63 and the first normal fuses NF1_MAT0~NF1_MAT15 and NF1_ECC may be used to store mat information and column line information on a repair process during the repair operation for the first normal mats ML0~ML15 and the first ECC mat ECC_ML included in the first mat group 110.

The first redundancy fuses RF1_YI0~RF1_YI63 may be allocated to respective ones of the first to $64^{th}$ column lines YI0~YI63 in each of the first normal mats ML0~ML15 and the first ECC mat ECC_ML. Thus, the number of the first redundancy fuses RF1_YI0~RF1_YI63 may be equal to the number of the column lines YI0~YI63 in each of the first normal mats ML0~ML15. For example, the first left redundancy fuse RF1_YI0 may be allocated to the first column lines YI0s in the first normal mats ML0~ML15 and the first ECC mat ECC_ML. Similarly, the $64^{th}$ left redundancy fuse RF1_YI63 may be allocated to the $64^{th}$ column lines YI63s in the first normal mats ML0~ML15 and the first ECC mat ECC_ML.

Each of the first redundancy fuses RF1_YI0~RF1_YI63 may store information on a first normal mat including a failed column line which is replaced with one of the first redundancy column lines RYI0~RYI31 in the first redundancy mat R_ML in the first repair mode. For example, when the first column line YI0 of the first left normal mat ML0 is repaired with the first redundancy column line RYI0 of the first redundancy mat R_ML, the first left redundancy fuse RF1_YI0 may store information on the first left normal mat ML0 including the first column line YI0 which is repaired with the first redundancy column line RYI0. That is, whether the first column line YI0 of the first left normal mat ML0 is repaired with the first redundancy column line RYI0 of the first redundancy mat R_ML may be verified by a state of the first left redundancy fuse In the event that the first column line YI0 of the first left normal mat ML0 is repaired with the first redundancy column line RYI0 of the first redundancy mat R_ML, the first redundancy column line RYI0 of the first redundancy mat R_ML may be selected when a column address for selecting the first column line YI0 of the first left normal mat LO is input.

The first normal fuses NF1_MAT0~NF1_MAT15 and NF1_ECC may be allocated to the first normal mats ML0~ML15 and the first ECC mat ECC_ML, respectively. For example, the first left normal fuse NF1_MAT0 may be allocated to the first left normal mat ML0, and the sixteenth left normal fuse NF1_MAT15 may be allocated to the sixteenth left normal mat ML15. In addition, the last one (i.e., the seventeenth left normal fuse NF1_ECC) of the first normal fuses NF1_MAT0~NF1_MAT15 and NF1_ECC may be allocated to the first ECC mat ECC_ML.

In an embodiment, each of the first normal fuses NF1_MAT0~NF1_MAT15 and NF1_ECC may store a partially inverted column address, which is generated by inverting a portion of a column address of a failed column line in one left normal mat (one of the first normal mats ML0~ML15) or the first ECC mat ECC_ML, in the second repair mode. Due to the presence of the first normal fuses NF1_MAT0~NF1_MAT15 and NF1_ECC, a repair operation for a failed column line in the second repair mode may be executed using another column line in one of the first normal mats ML0~ML15 and the first ECC mat ECC_ML which includes the failed column line.

In an embodiment, each of the first normal fuses NF1_MAT0~NF1_MAT15 may store information on whether a repair operation in the third repair mode has been already performed for another first normal mat adjacent to the first normal mat to which the first normal fuse is allocated. Accordingly, an $I^{th}$ left normal fuse (i.e., an odd-numbered left normal fuse) and an $(I+1$ or $I-1)^{th}$ left normal fuse (i.e., an even-numbered left normal fuse) adjacent to each other may constitute a pair of normal fuses (where, "I" is an odd number). That is, when a repair operation for an odd-numbered left normal mat allocated to an odd-numbered left normal fuse is performed in the third repair mode, the information on that the repair operation for the odd-numbered left normal mat is performed in the third repair mode may be stored in the even-numbered left normal fuse allocated to the even-numbered left normal mat. Similarly, when a repair operation for an even-numbered left normal mat allocated to an even-numbered left normal fuse is performed in the third repair mode, the information on that the repair operation for the even-numbered left normal mat is performed in the third repair mode may be stored in the odd-numbered left normal fuse allocated to the odd-numbered left normal mat. In such a case, each of the first normal fuses NF1_MAT0~NF1_MAT15 may store a partially inverted column address generated by inverting a portion of a column address of a failed column line which is repaired in the third repair mode. Due to the presence of the first normal fuses NF1_MAT0~NF1_MAT15, a repair operation for a failed column line of one left normal mat in the third repair mode may be executed using another column line of the one left normal mat including the failed column line.

Figure 6:
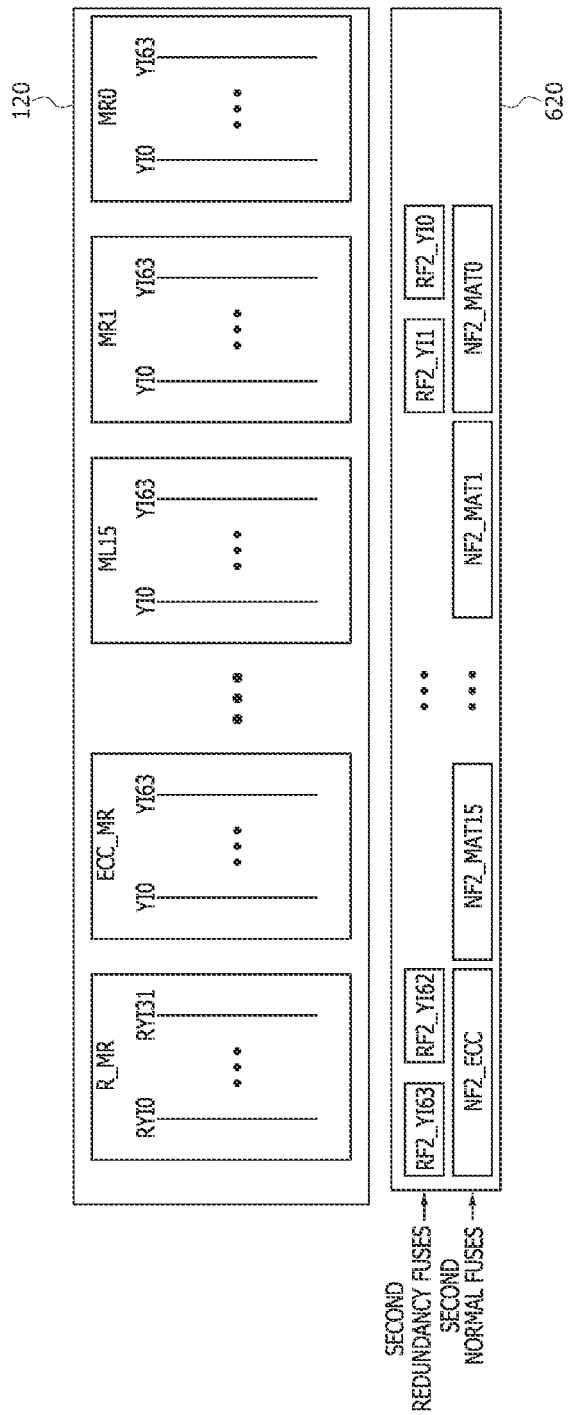
FIG. 6 illustrates an example of a second fuse circuit for repair processes according to first to third repair modes of second normal mats and a second ECC mat which are included in the memory device shown in FIG. 2.

FIG. 6 illustrates an example of a second fuse circuit 620 for the repair operations according to first to third repair modes of the second normal mats MR0~MR15 and the second ECC mat ECC_MR which are included in the memory device 10 shown in FIG. 2. Referring to FIG. 6, the memory device 10 may include the second fuse circuit 620 allocated to the second mat group 120. The second fuse circuit 620 may include a plurality of second redundancy fuses (e.g., first to $64^{th}$ right redundancy fuses RF2_YI0~RF2_YI63) and a plurality of second normal fuses (e.g., first to $17^{th}$ right normal fuses NF2_MAT0~NF2_MAT15 and NF2_ECC). The second redundancy fuses RF2_YI0~RF2_YI63 and the second normal fuses NF2_MAT0~NF2_MAT15 and NF2_ECC may be used to store mat information and column line information on a repair process during the repair operation for the second normal mats MR0~MR15 and the second ECC mat ECC_MR included in the second mat group 120.

The second redundancy fuses RF2_YI0~RF2_YI63 may be allocated to respective ones of the first to $64^{th}$ column lines YI0~YI63 in each of the second normal mats MR0~MR15 and the second ECC mat ECC_MR. Thus, the number of the second redundancy fuses RF2_YI0~RF2_YI63 may be equal to the number of the column lines YI0~YI63 in each of the second normal mats MR0~MR15. For example, the first right redundancy fuse RF2_YI0 may be allocated to the first column lines YI0s in the second normal mats MR0~MR15 and the second ECC mat ECC_MR. Similarly, the $64^{th}$ right redundancy fuse RF2_YI63 may be allocated to the $64^{th}$ column lines YI63s in the second normal mats MR0~MR15 and the second ECC mat ECC_MR.

Each of the second redundancy fuses RF2_YI0~RF2_YI63 may store information on a second normal mat including a faded column line which is replaced with one of the second redundancy column lines RYI0~RYI31 in the second redundancy mat R_MR in the first repair mode. For example, when the first column line YI0 of the first right normal mat MR0 is repaired with the first redundancy column line RYI0 of the second redundancy mat R_MR, the first right redundancy fuse RF2_YI0 may store information on the first right normal mat MR0 including the first column line YI0 which is repaired with the first redundancy column line RYI0. That is, whether the first column line YI0 of the first right normal mat MR0 is repaired with the first redundancy column line RYI0 of the second redundancy mat R_MR may be verified by a state of the first right redundancy fuse RF2_YI0. In the event that the first column line YI0 of the first right normal mat MR0 is repaired with the first redundancy column line RYI0 of the second redundancy mat R_MR, the first redundancy column line RYI0 of the second redundancy mat R_MR may be selected when a column address for selecting the first column line YI0 of the first right normal mat MR0 is input.

The second normal fuses NF2_MAT~NF2_MAT15 and NF2_ECC may be allocated to the second normal mats MR0~MR15 and the second ECC mat ECC_MR, respectively. For example, the first right normal fuse NF2_MAT0 may be allocated to the first right normal mat MR0, and the sixteenth right normal fuse NE2_MAT15 may be allocated to the sixteenth right normal mat MR15. In addition, the last one (i.e., the seventeenth right normal fuse NF2_ECC) of the second normal fuses NF2_MAT0~NF2_MAT15 and NF2_ECC may be allocated to the second ECC mat ECC_MR.

In an embodiment, each of the second normal fuses NF2_MAT0~NF2_MAT15 and NF2_ECC may store a partially inverted column address, which is generated by inverting a portion of a column address of a failed column line in one right normal mat (one of the second normal mats MR0~MR15) or the second ECC mat ECC_MR, in the second repair mode. Due to the presence of the second normal fuses NF2_MAT0~NF2_MAT15 and NF2_ECC, a repair operation for a failed column line in the second repair mode may be executed using another column line in one of the second normal mats MR0~MR15 and the second ECC mat ECC_MR, which includes the failed column line.

In an embodiment, each of the second normal fuses NF2_MAT0~NF2_MAT15 may store information on whether a repair operation in the third repair mode has been already performed for another second normal mat adjacent to the second normal mat to which the second normal fuse is allocated. Accordingly, an $I^{th}$ right normal fuse (i.e., an odd-numbered right normal fuse) and an $(I+1$ or $I-1)^{th}$ right normal fuse (i.e., an even-numbered right normal fuse) adjacent to each other may constitute a pair of normal fuses (where, "I" is an odd number). That is, when a repair operation for an odd-numbered right normal mat allocated to an odd-numbered right normal fuse is performed in the third repair mode, the information on that the repair operation for the odd-numbered right normal mat is performed in the third repair mode may be stored in the even-numbered right normal fuse allocated to the even-numbered right normal mat. Similarly, when a repair operation for an even-numbered right normal mat allocated to an even-numbered right normal fuse is performed in the third repair mode, the information on that the repair operation for the even-numbered right normal mat is performed in the third repair mode may be stored in the odd-numbered right normal fuse allocated to the odd-numbered right normal mat. In such a case, each of the second normal fuses NF2_MAT0~NF2_MAT15 may store a partially inverted column address generated by inverting a portion of a column address of a failed column line which is repaired in the third repair mode. Due to the presence of the second normal fuses NF2_MAT0~NF2_MAT15, a repair operation for a failed column line of one right normal mat in the third repair mode may be executed using another column line of the one right normal mat including the failed column line.

Figure 7:
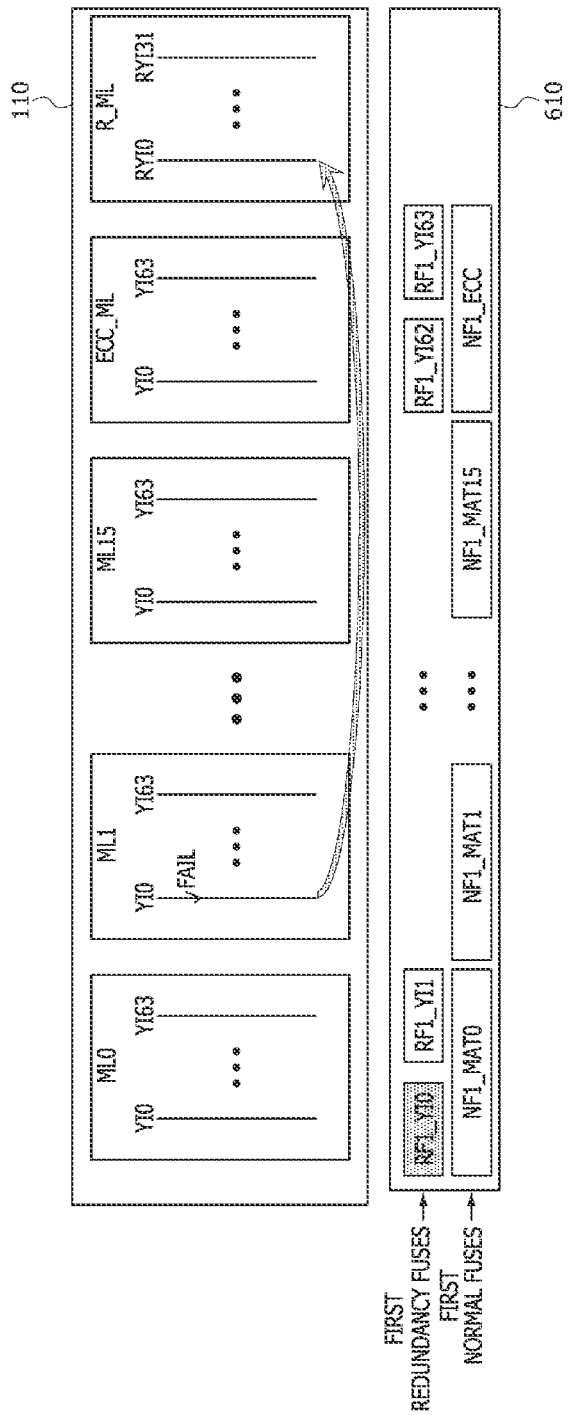
FIG. 7 illustrates an example of a repair operation performed in a first repair mode of the memory device shown in FIG. 2.

FIG. 7 illustrates an example of a repair operation performed in the first repair mode of the memory device 10 shown in FIG. 2. Although the present embodiment describes in conjunction with the repair operation for the first mat group 110, the present embodiment may be equally applicable to the repair operation for the second mat group 120. Hereinafter, it may be assumed that the first column line YI0 of the second left normal mat ML1 in the first mat group 110 is a failed column line. Referring to FIG. 7, the first column line YI0 corresponding to the failed column line of the second left normal mat ML1 may be replaced with the first redundancy column line RYI0 of the first redundancy mat R_ML, and the information on the second left normal mat ML1 may be stored in the first left redundancy fuse RF1_YI0 corresponding to the first column lines YI0s among the first redundancy fuses of the first fuse circuit 610. During the access operation for accessing to the first column line YI0 of the first mat group 110, no access to the failed first column line VI0 of the second left normal mat ML1 is executed. Instead, the first redundancy column line RYI0 of the first redundancy mat R_ML may be selected according to the information stored in the first left redundancy fuse RF1_YI0.

Figure 8:
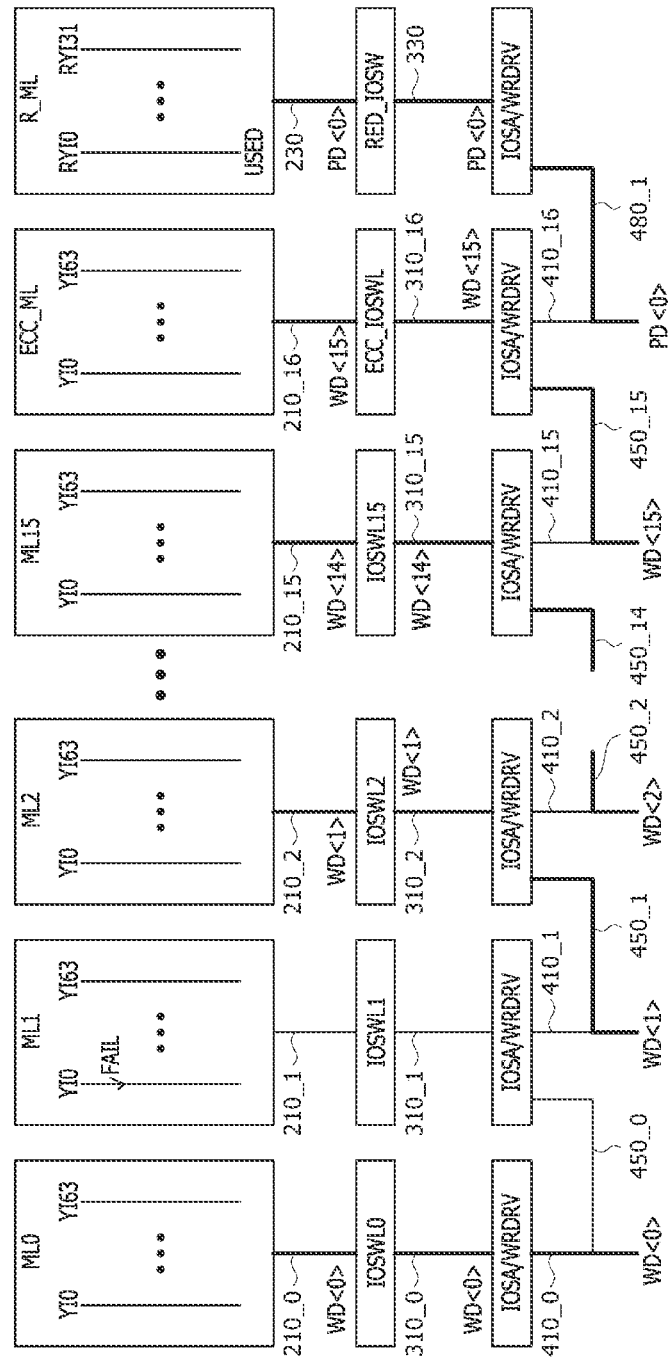
FIG. 8 illustrates a shift process of a data transmission path during a data write operation for a first mat group after a repair operation performed in a first repair mode of the memory device shown in FIG. 2.
Figure 9:
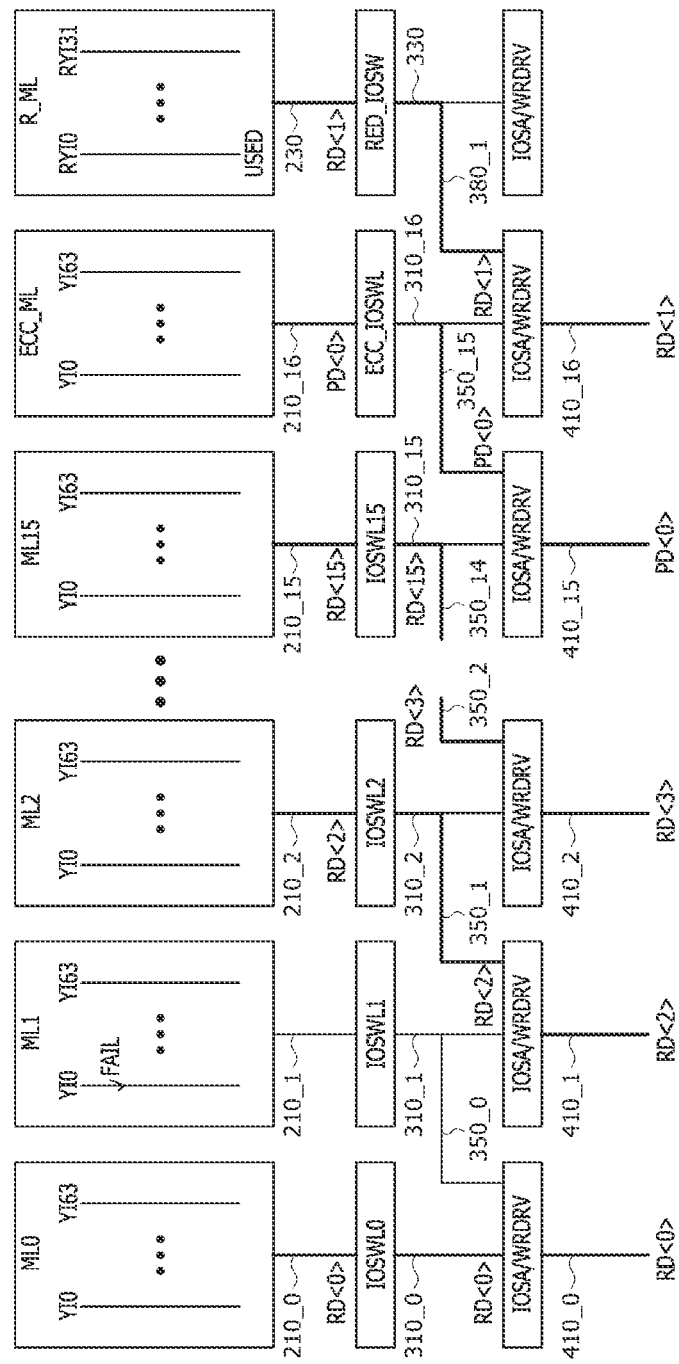
FIG. 9 illustrates a shift process of a data transmission path during a data read operation for a first mat group after a repair operation performed in a first repair mode of the memory device shown in FIG. 2.

FIGS. 8 and 9 illustrate data transmission paths which are shifted after repair operations of the memory device 10 shown in FIG. 2 are performed in the first repair mode. For example, FIG. 8 illustrates a shift process of data transmission paths during the data write operation for the first mat group 110, and FIG. 9 illustrates a shift process of data transmission paths during the data read operation for the first mat group 110. Descriptions illustrated with reference to FIGS. 8 and 9 may be equally applicable to the second mat group 120.

First, referring to FIG. 8, it may be assumed that a write operation for the first mat group 110 is requested and the first column lines YI0s in the first mat group 110 are selected by a column address during the write operation. In FIG. 8, the I/O lines used for transmission of write data WD<15:0> and parity data PD<0> are illustrated with bold lines to be distinguished from other I/O line which are unused for transmission of the write data WD<15:0> and the parity data PD<0>. The write data WD<15:0> may be input through the global I/O line (500 of FIG. 2), and the parity data PD<0> may be provided by an ECC encoder (not shown). As illustrated in FIG. 8, the write data WD<0> may be normally transmitted to the first normal mat (i.e., the first left normal mat ML0) located in advance of the second left normal mat ML1 having the failed column line YI0 without any shift of the data transmission path. In contrast, the write data WD<15:1> to be transmitted to the second to sixteenth left normal mats ML1~ML15 and the parity data PD<0> to be transmitted to the first ECC mat ECC_ML may be transmitted through shifted I/O paths.

For example, the write data WD<0> to be transmitted to the first left normal mat ML0 may be transmitted to the write driver WRDRV allocated to the first left normal mat ML0 through the first enhanced I/O line 410_0. The write driver WRDRV allocated to the first left normal mat ML0 may transmit the write data WD<0> to the first left I/O switch IOSWL0 through the first local I/O line 310_0. The first left I/O switch IOSWL0 may transmit the write data WD<0> to the first left normal mat ML0 through the first segmented I/O line 210_0.

The write data WD<1> to be transmitted to the second left normal mat ML1 having the failed first column line YI0 may be shifted and transmitted to the write driver WRDRV allocated to the third left normal mat ML2 through the first shift enhanced I/O line 450_1. The write driver WRDRV allocated to the third left normal mat ML2 may transmit the write data WD<1> to the third left I/O switch IOSWL2 through the first local I/O line 310_2. The third left I/O switch IOSWL2 may transmit the write data WD<1> to the third left normal mat ML2 through the first segmented I/O line 210_2.

The write data WD<14:2> to be transmitted to the third to fifteenth left normal mats ML2~ML14 may also be transmitted to respective ones of the fourth to sixteenth left normal mats ML3~ML15 through shifted transmission paths in the same way as described above. The write data WD<15> to be transmitted to the sixteenth left normal mat ML15 may be shifted and transmitted to the write driver WRDRV allocated to the first ECC mat ECC_ML through the first shift enhanced I/O line 450_15. The write driver WRDRV allocated to the first ECC mat ECC_ML may transmit the write data WD<15> to the first ECC I/O switch ECC_IOSWL through the first local I/O line 310_16. The first ECC I/O switch ECC_IOSWL may transmit the write data WD<15> to the first ECC mat ECC_ML through the first segmented I/O line 210_16.

The parity data PD<0> to be transmitted to the first ECC mat ECC_ML may be shifted and transmitted to the write dryer WRDRV allocated to the first redundancy mat R_ML through the first shift redundancy enhanced I/O line 480_1. The write driver WRDRV allocated to the first redundancy mat R_ML may transmit the parity data PD<0> to the redundancy I/O switch RED_IOSW through the redundancy local I/O line 330. The redundancy I/O switch RED_IOSW may transmit the parity data PD<0> to the first redundancy mat R_ML through the redundancy segmented I/O line 230.

Next, referring to FIG. 9, it may be assumed that a read operation for the first mat group 110 is requested and the first column lines YI0s in the first mat group 110 are selected by a column address during the read operation. In FIG. 9, the I/O lines used for transmission of read data RD<15:0> and parity data PD<0> are illustrated with bold lines to be distinguished from other I/O line which are unused for transmission of the read data RD<15:0> and the parity data PD<0>. As illustrated in FIG. 9, the read data RD<0> output from the first normal mat (i.e., the first left normal mat ML0) located in advance of the second left normal mat ML1 having the failed column line YI0 may be normally transmitted without any shift of the data transmission path. In contrast, the read data RD<15:2> output from the third to sixteenth left normal mats ML2~ML15 next to the second left normal mat ML1 having the failed column line YI0 may be transmitted though shifted I/O paths. The parity data PD<0> output from the first ECC mat ECC_ML may also be transmitted through a shifted I/O path. In addition, the read data RD<1> output from the first redundancy mat R_ML instead of the second left normal mat ML1 having the failed column line YI0 may also be transmitted through a shifted I/O path.

For example, the read data RD<0> output from the first left normal mat ML0 may be transmitted to the first left I/O switch IOSWL0 through the first segmented I/O line 210_0. The read data RD<0> may be transmitted from the first left I/O switch IOSWL0 to the I/O sense amplifier IOSA allocated to the first left normal mat ML0 through the first local I/O line 310_0. The I/O sense amplifier IOSA allocated to the first left normal mat ML0 may amplify the read data RD<0> input through the first local I/O line 310_0 to output the amplified read data to the first enhanced I/O line 410_0. Although not shown in FIG. 9, the read data RD<0> loaded on the first enhanced I/O line 410_0 may be output as output data of the memory device 10 through the global I/O line (500 of FIG. 2).

Because no read data are output from the second left normal flat ML1 including the faded column line YI0, a transmission path including the first segmented I/O line 210_1, the first local I/O line 310_1, and the first shift local I/O line 350_0 allocated to the second left normal mat ML1 is not used as a transmission path of the read data. However, the I/O sense amplifier IOSA and the first enhanced I/O line 410_1 allocated to the second left normal mat ML1 may be used as a shifted path for transmission of the read data RD<2> output from the third left normal mat ML2.

The read data RD<2> output from the third left normal mat ML2 may be transmitted to the third left I/O switch IOSWL2 through the first segmented I/O line 210_2. The read data RD<2> output from the third left I/O switch IOSWL2 may be shifted and transmitted to the I/O sense amplifier IOSA allocated to the second left normal mat ML1 through the first shift local I/O line 350_1. The I/O sense amplifier IOSA allocated to the second left normal mat ML1 may amplify the read data RD<2> input through the first shift local I/O line 350_1 to output the amplified read data to the first enhanced I/O line 410_1.

In the same way as described above, the read data RD<3> output from the fourth left normal mat ML3 may be shifted and transmitted to the I/O sense amplifier IOSA allocated to the third left normal mat ML2 through the first shift local I/O line 350_2. The I/O sense amplifier IOSA allocated to the third left normal mat ML2 may amplify the read data RD<3> input through the first shift local I/O line 350_2 to output the amplified read data to the first enhanced I/O line 410_2. Similarly, the read data RD<15> output from the sixteenth left normal mat ML15 may be shifted and transmitted to the I/O sense amplifier IOSA allocated to the fifteenth left normal mat ML14 through the first segmented I/O line 210_15, the sixteenth left I/O switch IOSWL15, and the first shift local I/O line 350_14. The I/O sense amplifier IOSA allocated to the fifteenth left normal mat ML14 may amplify the read data RD<15> input through the first shift local I/O line 350_14 to output the amplified read data to the first enhanced I/O line 410_14 allocated to the fifteenth left normal mat ML14.

The parity data PD<0> output from the first ECC mat ECC_ML may be shifted and transmitted to the I/O sense amplifier IOSA allocated to the sixteenth left normal mat ML15 through the first segmented I/O line 210_16, the first ECC I/O switch ECC_IOSWL, and the first shift local I/O line 350_15. The I/O sense amplifier IOSA allocated to the sixteenth left normal mat ML15 may amplify the parity data PD<0> input through the first shift local I/O line 350_15 to output the amplified read data to the first enhanced I/O line 410_15 allocated to the sixteenth left normal mat ML15. The read data RD<1> output from the first redundancy mat R_ML may be shifted and transmitted to the I/O sense amplifier IOSA allocated to the first ECC mat ECC_ML through the redundancy segmented I/O line 230, the redundancy I/O switch RED_IOSW, and the first shift redundancy local I/O line 380_1. The I/O sense amplifier IOSA allocated to the first ECC mat ECC_ML may amplify the read data RD<1> input through the first shift redundancy local I/O line 380_1 to output the amplified data of the read data RD<1> to the first enhanced I/O line 410_16 allocated to the first ECC mat ECC_ML.

Figure 10:
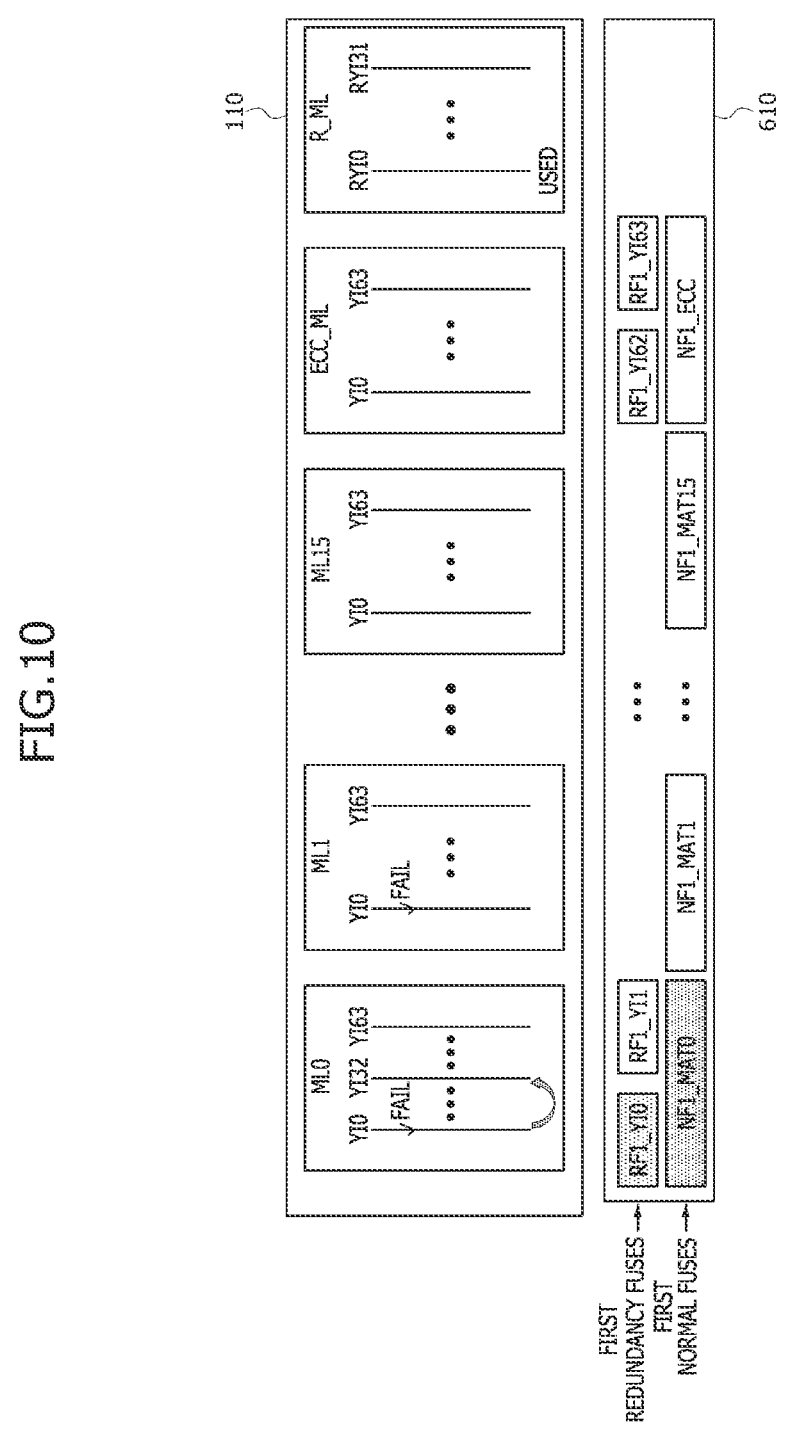
Figure 11:
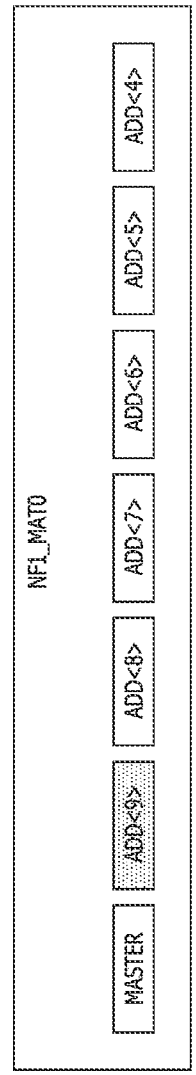
FIG. 11 illustrates a configuration of a first normal fuse when a repair operation is performed in a second repair mode of a memory device according to an embodiment of the present disclosure.

FIG. 10 illustrates the repair operation performed in the second repair mode of the memory device 10 illustrated in FIG. 2, and FIG. 11 illustrates a configuration of the first left normal fuse NF1_MAT0 when the repair operation is performed in the second repair mode of the memory device 10. The repair operation performed in the second repair mode may be preceded by the repair operation performed in the first repair mode. Although FIGS. 10 and 11 illustrate in conjunction with the repair operation for the first mat group 110, the embodiment described with reference to FIGS. 10 and 11 may also be equally applicable to the repair operation for the second mat group 120. As described with reference to FIG. 7, it may be assumed that the failed column line YI0 in the second left normal mat ML1 has been already replaced with the first redundancy column line RYI0 in the first redundancy mat R_ML by the repair operation performed in the first repair mode. In addition, the information on the second left normal mat MLA may be stored in the first left redundancy fuse RF1_YI0 corresponding to the first column lines YI0s disposed in the first mat group 110 among the first redundancy fuses RF1_YI0~RF1_YI63 of the first fuse circuit 610. In the present embodiment, it may be assumed that the first column line YI0 among the column lines YI0~YI63 in the first left normal mat ML0 is an additional failed column line (i.e., a second faded column line).

First, referring to FIG. 10, the first redundancy column line RYI0 of the first redundancy mat R_ML for replacing one of the first column lines YI0 during the repair process has been already used during the repair process for replacing the failed column line (i.e., the first column line YI0) of the second left normal mat ML1 in the first repair mode. Thus, the second failed column line (i.e., the first column line YI0 in the first left normal mat ML0) cannot be repaired using the first redundancy mat R_ML. In such a case, the repair operation for the second failed column line (i.e., the first column line YI0 in the first left normal mat ML0) in the second repair mode may be performed using the first left normal fuse NF1_MAT0 allocated to the first left normal mat ML0. The repair operation in the second repair mode may be performed by replacing the second failed column line (i.e., the first column line YI0 in the first left normal mat ML0) with another column line in the first left normal mat ML0. In such a case, a column address of a column line replacing the second failed column line (i.e., the first column line YI0 in the first left normal mat ML0) may be obtained by inverting at least one of bits included in the column address of the second failed column line. The present embodiment may be described in conjunction with a case that the column address of the second faded column line is a 6-bit binary stream and a column address of a column line replacing the second faded column line is obtained by inverting a most significant bit (MSB) ADD<9> of a column address ADD<9:4> of the second faded column line. In such a case, the second faded column line (i.e., the first column line YI0 in the first left normal mat ML0) may be replaced with the 33$^{rd}$ column line YI32 in the first left normal mat ML0.

As illustrated in FIG. 11, the first left normal fuse NF1_MAT0 may include a master fuse MASTER and bit fuses ADD<9>~ADD<4> corresponding to respective ones of the binary bits included in the column address ADD<9:4>. Each of the second to seventeenth left normal fuses NF1_MAT1~NF1_MAT15 and NF1_ECC may also have the same configuration as the first left normal fuse NF1_MAT0. According to the present embodiment, in order to replace the first column line YI0 (i.e., the second failed column line) in the first left normal mat ML0 with the 33$^{rd}$ column line YI32 in the first left normal mat ML0, the bit fuse ADD<9> of the first left normal fuse NF1_MAT0 corresponding to the MSB of the column address ADD<9:4> of the first column line YI0 (i.e., the second failed column line) may be cut to invert the MSB ADD<9> of the column address ADD<9:4> of the first column line YI0 (i.e., the second failed column line) in the first left normal mat ML0. Thus, when the column address ADD<9:4> designating the first column line YI0 (i.e., the second failed column line) is input to the first left normal fuse NF1_MAT0, the MSB of the column address ADD<9:4> of the first column line YI0 may be inverted so that an inverted column address designating the 33$^{rd}$ column line YI32 in the first left normal mat ML0 is transmitted from the first left normal fuse NF1_MAT0 to the first left normal mat ML0.

Figure 12:
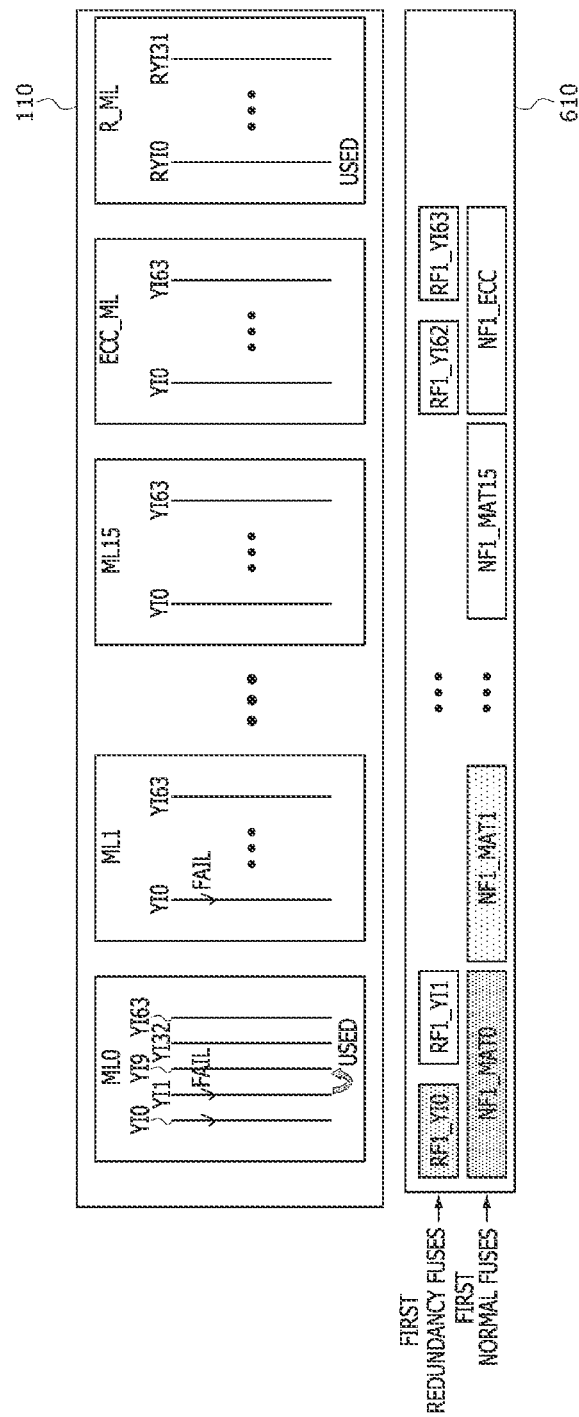
FIG. 12 illustrates a repair operation according to a third repair mode of a memory device according to an embodiment of the present disclosure.
Figure 13:
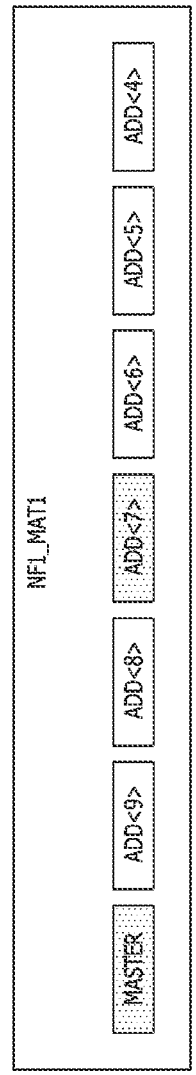
FIG. 13 illustrates a configuration of a first normal fuse when a repair operation is performed in a third repair mode of a memory device according to an embodiment of the present disclosure.

FIG. 12 illustrates the repair operation performed in the third repair mode of the memory device 10 illustrated in FIG. 2, and FIG. 13 illustrates a configuration of the first and second left normal fuses NF1_MAT0 and NF1_MAT1 when the repair operation is performed in the third repair mode of the memory device 10. The repair operation performed in the third repair mode may be preceded by the repair operation performed in the second repair mode. Although FIGS. 12 and 13 illustrate in conjunction with the repair operation for the first mat group 110, the embodiment described with reference to FIGS. 12 and 13 may also be equally applicable to the repair operation for the second mat group 120. The present embodiment will be described in conjunction with a case that the repair operation in the first repair mode illustrated in FIG. 7 and the repair operation in the second repair mode illustrated in FIGS. 10 and 11 are performed in advance. In addition, it may be assumed that the second column line YI1 among the column lines YI0~YI63 in the first left normal mat ML0 is an additional failed column line (i.e., a third failed column line) in the present embodiment. Moreover, it may be assumed that the second redundancy column line RYI1 (not shown in FIG. 12) for repairing the second column line YI1 (i.e., the third failed column line) in the first left normal mat ML0 has been already used.

First, referring to FIG. 12, because the first redundancy column line RYI0 of the first redundancy mat R_ML has been already used in the first repair mode, the third failed column line (i.e., the second column line YI1 in the first left normal mat ML0) cannot be repaired using the first redundancy mat R_ML. In addition, because the first left normal fuse NF1_MAT0 corresponding to the first left normal mat ML0 has been already used in the second repair mode, the third failed column line (i.e., the second column line YI1 in the first left normal mat ML0) cannot be repaired using the first left normal fuse NF1_MAT0. In such a case, the repair operation in the third repair mode (i.e., the repair operation for the second column line YI1 in the first left normal mat ML0) may be repaired using the second left normal fuse NF1_MAT1 corresponding to the second left normal mat ML1 which is one of the pair of normal mats including the first left normal mat ML0. The repair operation in the third repair mode may be performed by replacing the third failed column line (i.e., the second column line YI1 in the first left normal mat ML0) with another column line in the first left normal mat ML0. In such a case, a column address of a column line replacing the third failed column line (i.e., the second column line YI1 in the first left normal mat ML0) may be obtained by inverting at least one of bits included in the column address of the third faded column line. The present embodiment may be described in conjunction with a case that a column address of a column line replacing the third failed column line (i.e, the second column line YI1) is obtained by inverting a fourth bit ADD<7> of the column address ADD<9:4> of the third faded column line. In such a case, the third failed column line (i.e., the second column line YI1 in the first left normal mat ML0) may be replaced with the tenth column line YI9 in the first left normal mat ML0.

As illustrated in FIG. 13, in order to replace the second column line YI1 (i.e., the third failed column line) in the first left normal mat ML0 with the tenth column line YI9 in the first left normal mat ML0, the master fuse MASTER of the second left normal fuse NF1_MAT1 corresponding to the second left normal mat ML1 and the bit fuse ADD<7> corresponding to the fourth bit of the second column line YI1 (i.e., the third failed column line) may be cut to invert the fourth bit ADD<7> of the column address ADD<9:4> of the second column line YI1 (i.e., the third failed column line) in the first left normal mat ML0. The cut master fuse MASTER of the second left normal fuse NF1_MAT1 means that the second left normal fuse NF1_MAT1 corresponding to the second left normal mat ML1 has been used for the repair operation of the first left normal mat ML0 in the third repair mode. The cut bit fuse ADD<7> of the second left normal fuse NF1_MAT1 means that the second column line YI1 (i.e., the third failed column line) of the first left normal mat ML0 has been replaced with the tenth column line YI9 of the first left normal mat ML0. Thus, when the column address ADD<9:4> designating the second column line YI1 (i.e., the third faded column line) is input to the second left normal fuse NF1_MAT1, the fourth bit ADD<7> of the column address ADD<9:4> of the second column line YI1 (i.e., the third faded column line) may be inverted so that the inverted column address designating the tenth column line YI9 of the first left normal mat ML0 is output from the second left normal fuse NF1_MAT1 and is transmitted to the first left normal mat ML0 through the first left normal fuse NF1_MAT0.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combi-

What is claimed is:

1. A memory device comprising:
a plurality of first normal mats and a plurality of second normal mats, wherein each of the plurality of first normal mats and each of the plurality of second normal mats include column lines, respectively;
a first redundancy mat including first redundancy column lines, wherein each of the first redundancy column lines replace failed column line among the column lines disposed in the each of the plurality of first normal mats;
a second redundancy mat including second redundancy column lines, wherein each of the second redundancy column lines replace failed column line among the column lines disposed in the each of the plurality of second normal mats; and
a redundancy segmented input/output (I/O) line coupled to both the first redundancy mat and the second redundancy mat.

2. The memory device of claim 1,
wherein the redundancy segmented I/O line connects the first and second redundancy mats to a redundancy local I/O line.

3. The memory device of claim 1,
wherein the number of the first redundancy column lines is half the number of the column lines included in each of the first normal mats; and
wherein the number of the second redundancy column lines is half the number of the column lines included in each of the second normal mats.

4. The memory device of claim 1,
wherein the number of the first redundancy column lines is less than the number of the column lines included in each of the first normal mats; and
wherein the number of the second redundancy column lines is less than the number of the column lines included in each of the second normal mats.

5. The memory device of claim 1,
wherein one of first row lines, each of which is disposed to traverse all of the first normal mats and the first redundancy mat, is selected by a first active command and a first row address; and
wherein one of second row lines, each of which is disposed to traverse all of the second normal mats and the second redundancy mat, is selected by a second active command and a second row address.

6. The memory device of claim 1, wherein a size of a page provided by the first normal mats is equal to a size of a page provided by the second normal mats.

7. The memory device of claim 2, further comprising:
a first segmented I/O line, a first local I/O line, and a first enhanced I/O line which are allocated to each of the first normal mats; and
a second segmented I/O line, a second local I/O line, and a second enhanced I/O line which are allocated to each of the second normal mats.

8. The memory device of claim 7,
wherein each of the first normal mats includes a first bit line sense amplifier coupled to the first segmented I/O line;
wherein the first redundancy mat includes a first redundancy bit line sense amplifier coupled to the redundancy segmented I/O line;
wherein each of the second normal mats includes a second bit line sense amplifier coupled to the second segmented I/O line; and
wherein the second redundancy mat includes a second redundancy bit line sense amplifier coupled to the redundancy segmented I/O line.

9. The memory device of claim 8, further comprising:
first I/O switches allocated to respective ones of the first normal mats and coupled between the first segmented I/O lines and the first local I/O lines;
second I/O switches allocated to respective ones of the second normal mats and coupled between the second segmented I/O lines and the second local I/O lines; and
a redundancy I/O switch allocated to both of the first redundancy mat and the second redundancy mat and coupled between the redundancy segmented I/O line and the redundancy local I/O line.

10. The memory device of claim 9, further comprising:
first I/O sense amplifier and write (amplifier/write) driver circuits allocated to respective ones of the first normal mats and coupled between the first local I/O lines and the first enhanced I/O lines;
second I/O sense amplifier/write driver circuits allocated to respective ones of the second normal mats and coupled between the second local I/O lines and the second enhanced I/O lines; and
a redundancy I/O sense amplifier/write driver circuit allocated to both of the first redundancy mat and the second redundancy mat and coupled to the redundancy local I/O line.

11. The memory device of claim 10,
wherein the first normal mats include first to $K^{th}$ left normal mats, wherein K is a natural number;
wherein the first I/O switches include first to $K^{th}$ left I/O switches allocated to respective ones of the first to $K^{th}$ left normal mats;
wherein the first I/O sense amplifier/write driver circuits include first I/O sense amplifiers and first write drivers;
wherein the first I/O sense amplifiers include first to $K^{th}$ left I/O sense amplifiers allocated to respective ones of the first to $K^{th}$ left normal mats;
wherein the first write drivers include first to $K^{th}$ left write drivers allocated to respective ones of the first to $K^{th}$ left normal mats;
wherein the second normal mats include first to $K^{th}$ right normal mats;
wherein the second I/O switches include first to $K^{th}$ right I/O switches allocated to respective ones of the first to $K^{th}$ left normal mats;
wherein the second I/O sense amplifier/write driver circuits include second I/O sense amplifiers and second write drivers;
wherein the second I/O sense amplifiers include first to $K^{th}$ right I/O sense amplifiers allocated to respective ones of the first to $K^{th}$ right normal mats; and
wherein the second write drivers include first to $K^{th}$ right write drivers allocated to respective ones of the first to $K^{th}$ right normal mats,
wherein the memory device further includes:
first shift local I/O lines connecting the second to $K^{th}$ left I/O switches to respective ones of the first to $(K-1)^{th}$ left I/O sense amplifiers;
second shift local I/O lines connecting the second to $K^{th}$ right I/O switches to respective ones of the first to $(K-1)^{th}$ right I/O sense amplifiers;

a first shift redundancy local I/O line connecting the redundancy I/O switch to the $K^{th}$ left I/O sense amplifier allocated to the $K^{th}$ left normal mat adjacent to the first redundancy mat; and a second shift redundancy local I/O line connecting the redundancy I/O switch to the $K^{th}$ right I/O sense amplifier allocated to the $K^{th}$ right normal mat adjacent to the second redundancy mat.

12. The memory device of claim 10,
wherein the first normal mats include first to $K^{th}$ left normal mats, wherein K is a natural number;
wherein the first enhanced I/O lines include first to $K^{th}$ left enhanced I/O lines allocated to respective ones of the first to $K^{th}$ left normal mats;
wherein the first I/O sense amplifier/write driver circuits include first I/O sense amplifiers and first write drivers;
wherein the first I/O sense amplifiers include first to $K^{th}$ left I/O sense amplifiers allocated to respective ones of the first to $K^{th}$ left normal mats;
wherein the first write drivers include first to $K^{th}$ left write drivers allocated to respective ones of the first to $K^{th}$ left normal mats;
wherein the second normal mats include first to $K^{th}$ right normal mats;
wherein the second enhanced I/O lines include first to $K^{th}$ right enhanced I/O lines allocated to respective ones of the first to $K^{th}$ right normal mats;
wherein the second I/O sense amplifier/write driver circuits include second I/O sense amplifiers and second write drivers;
wherein the second I/O sense amplifiers include first to $K^{th}$ right I/O sense amplifiers allocated to respective ones of the first to $K^{th}$ right normal mats; and
wherein the second write drivers include first to $K^{th}$ right write drivers allocated to respective ones of the first to $K^{th}$ right normal mats,
wherein the memory device further includes:
first shift enhanced I/O lines connecting the first to $(K-1)^{th}$ left enhanced I/O lines to respective ones of the second to $K^{th}$ left write drivers;
second shift enhanced I/O lines connecting the first to $(K-1)^{th}$ right enhanced I/O lines to respective ones of the second to $K^{th}$ right write drivers;
a first shift redundancy enhanced I/O line connecting the $K^{th}$ left enhanced I/O line allocated to the $K^{th}$ left normal mat adjacent to the first redundancy mat to a redundancy write driver allocated to both of the first and second redundancy mats; and
a second shift redundancy enhanced I/O line connecting the $K^{th}$ right enhanced I/O line allocated to the $K^{th}$ right normal mat adjacent to the second redundancy mat to the redundancy write driver.

13. The memory device of claim 1, further comprising:
a first error correction code (ECC) mat disposed between the first redundancy mat and one of the first normal mats, which is adjacent to the first redundancy mat, to store parity data; and
a second ECC mat disposed between the second redundancy mat and one of the second normal mats, which is adjacent to the second redundancy mat, to store parity data.

14. The memory device of claim 1, further comprising:
a first fuse circuit allocated to the first normal mats and the first redundancy mat; and
a second fuse circuit allocated to the second normal mats and the second redundancy mat.

15. The memory device of claim 14, wherein the first fuse circuit and the second fuse circuit have substantially the same configuration.

16. The memory device of claim 15, wherein the first fuse circuit includes:
a plurality of first redundancy fuses allocated to respective ones of the column lines disposed in each of the first normal mats; and
a plurality of first normal fuses allocated to respective ones of the first normal mats.

17. The memory device of claim 16, wherein when a repair operation is performed in a first repair mode for replacing a first failed column line of the column lines in the first normal mats with one of the first redundancy column lines in the first redundancy mat, one of the plurality of first redundancy fuses stores information on the first normal mat including the first failed column line.

18. The memory device of claim 16, wherein each of the first normal fuses includes:
a plurality of bit fuses configured to change a column address of a second failed column line in one of the first normal mats into a column address of a certain column line in the first normal mat including the second failed column line when a repair operation is performed in a second repair mode for replacing the second failed column line with the certain column line; and
a master fuse indicating an execution state or a non-execution state of a repair operation which is performed in a third repair mode for replacing a third failed column line in one of the first normal mats with another certain column line in the first normal mat including the third failed column line.

19. The memory device of claim 18, wherein when the repair operation is performed in the third repair mode, at least one of the bit fuses of the first normal fuse including the master fuse is cut to change a column address of the third failed column line into a column address of the other certain column line and the changed column address is transmitted to the first normal mat including the third failed column line.

20. The memory device of claim 19,
wherein the repair operation performed in the second repair mode may be preceded by the repair operation performed in the first repair mode; and
wherein the repair operation performed in the third repair mode may be preceded by the repair operation performed in the second repair mode.

21. The memory device of claim 19,
wherein the repair operation in the second repair mode is performed when the first redundancy column line corresponding to the second failed column line is in use due to a previous repair operation; and
wherein the repair operation in the third repair mode is performed when the first redundancy column line corresponding to the third failed column line is in use due to a previous repair operation and the first normal fuse allocated to the first normal mat including the third failed column line is in use due to a previous repair operation.

22. The memory device of claim 19, wherein an operation for changing the column address of the second failed column line into the column address of the certain column line using the bit fuses is performed by inverting at least one of bits included in the column address of the second failed column line.

23. The memory device of claim 19, wherein an operation for changing the column address of the third failed column line into the column address of the other certain column line using the master fuse and the bit fuses is performed by inverting at least one of bits included in the column address of the third failed column line.

\* \* \* \* \*